(12) United States Patent
McBeth

(10) Patent No.: US 11,244,098 B2
(45) Date of Patent: *Feb. 8, 2022

(54) ELECTRONIC DESIGN AUTOMATION

(71) Applicant: StarSystems, Inc., Colbert, WA (US)

(72) Inventor: Fletcher McBeth, Colbert, WA (US)

(73) Assignee: StarSystems, Inc., Colbert, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/990,935

(22) Filed: Aug. 11, 2020

(65) Prior Publication Data

US 2020/0372199 A1  Nov. 26, 2020

Related U.S. Application Data

(63) Continuation of application No. 15/999,203, filed on Aug. 17, 2018, now Pat. No. 10,747,927.

(60) Provisional application No. 62/547,729, filed on Aug. 18, 2017.

(51) Int. Cl.
*G06F 30/34* (2020.01)
*G06F 3/0484* (2013.01)
*G06F 8/34* (2018.01)

(52) U.S. Cl.
CPC .......... *G06F 30/34* (2020.01); *G06F 3/04845* (2013.01); *G06F 8/34* (2013.01)

(58) Field of Classification Search
CPC ......... G06F 30/34; G06F 3/04845; G06F 8/34
See application file for complete search history.

(56) References Cited

U.S. PATENT DOCUMENTS

| | | |
|---|---|---|
| 4,799,141 A | 1/1989 | Drusinsky et al. |
| 5,844,558 A | 12/1998 | Kumar et al. |
| 6,400,383 B1 * | 6/2002 | Geisler ................ G06F 3/0481 700/121 |
| 6,782,511 B1 | 8/2004 | Frank et al. |
| 7,949,990 B2 | 5/2011 | Pfeil et al. |
| 8,336,025 B1 | 12/2012 | Hosagrahara et al. |
| 10,282,506 B1 | 5/2019 | Meyer et al. |
| 2003/0217190 A1 | 11/2003 | Devine et al. |
| 2006/0155526 A1 | 7/2006 | Castillo et al. |
| 2008/0263516 A1 | 10/2008 | Hartadinata et al. |
| 2009/0199088 A1 | 8/2009 | Haug, III et al. |
| 2011/0035718 A1 * | 2/2011 | Mcbeth ................ G06F 30/327 716/136 |

* cited by examiner

*Primary Examiner* — Nghia M Doan
(74) *Attorney, Agent, or Firm* — Kilpatrick Townsend & Stockton LLP

(57) ABSTRACT

A method may designing electronic circuits is provided. The method may include generating a first user interface for displaying, at a client, a plurality of graphical elements for creating a state diagram. A scaffold may be added to the state diagram in response to the scaffold being selected from the plurality of graphical elements. A first state bubble may be attached to the scaffold in response to the first state bubble being selected from the plurality of graphical elements. A dimension of the scaffold and/or a position of the first state bubble on the scaffold may be adjusted in response to a second state bubble being added and/or removed from the state diagram. A second user interface may be generated for displaying, at the client, the state diagram. Related systems and articles of manufacture, including computer program products, are also provided.

21 Claims, 24 Drawing Sheets

ELECTRONIC DESIGN AUTOMATION

CROSS REFERENCE TO RELATED APPLICATION

This application is a continuation of U.S. application Ser. No. 15/999,203, filed on Aug. 17, 2018 and entitled "ELECTRONIC DESIGN AUTOMATION," which claims priority to U.S. Provisional Application No. 62/547,729, filed on Aug. 18, 2017 and entitled "ELECTRONIC DESIGN AUTOMATION SYSTEM AND METHOD," the entire contents of each which are incorporated herein in their entirety for all purposes.

TECHNICAL FIELD

The subject matter described herein relates to tools for designing and implementing communication systems, and more particularly to an engineering design automation system and method.

BACKGROUND

Electronic design automation (EDA) is a term used primarily for software tools for designing electronic systems such as integrated circuits (ICs), which include field programmable gate arrays (FPGAs) and application specific integrated circuits (ASICs). EDA tools typically work in a design flow that IC and chip designers can follow for architecting entire semiconductor chips to implement specific functionality or applications. EDA tools provide a graphical display of an electronic system being designed, so that an architect or engineer can efficiently and effectively model the electronic system graphically before the system is implemented in silicon, i.e. via a Very High Speed Integrated Circuit (VHSIC) Hardware Description Language (VHDL) program or the like.

The design flows of conventional EDA tools are based on state machines. A state machine is a mathematical model of computation, in which an abstract machine can be defined to have any number of states, and in which only one state the machine can exist at any one time. Changes from one state to another state of the model can be defined by a transition, which in turn is defined by an input (present state) and an output (after a processing or computational action on the present state). Modern EDA tools use state machines State machines can be graphically generated and represented or displayed in an EDA tool. However, as complexity of modern integrated circuits increases, traditional state machine representations by EDA tools become overly complicated and confusing, and architects of electronic circuits can experience frustration and confusion in designing complex electronic circuits.

SUMMARY

Systems, methods, and articles of manufacture, including computer program items, are provided for electronic design automation. In one aspect, there is provided a system. The system may include at least one data processor and at least one memory. The at least one memory may store instructions that cause operations when executed by the at least one data processor. The operations may include: generating a first user interface for displaying, at a client, a plurality of graphical elements for creating a state diagram; responding to a scaffold being selected from the plurality of graphical elements by at least adding the scaffold to the state diagram; responding to a first state bubble being selected from the plurality of graphical elements by at least attaching the first state bubble to the scaffold; responding to a second state bubble being added and/or removed from the state diagram by at least adjusting a dimension of the scaffold and/or adjusting a position of the first state bubble on the scaffold; and generating a second user interface for displaying, at the client, the state diagram.

In some variations, one or more features disclosed herein including the following features can optionally be included in any feasible combination. One or more transition arrows connecting the first state bubble, the second state bubble, and/or a third state bubble may be inserted into the state diagram. A position of the first state bubble, the second state bubble, and/or the third state bubble may be adjusted such that the one or more transition arrows intersect the first state bubble, the second state bubble, and/or the third state bubble perpendicularly. The position of the first state bubble, the second state bubble, and/or the third state bubble may be further adjusted such that the first state bubble, the second state bubble, and the third state bubble are spaced evenly along the scaffold.

In some variations, the first state bubble may be associated with an adjustable value. Attaching the first state bubble to the scaffold may include attaching, to the scaffold, a quantity of state bubbles corresponding to the adjustable value.

In some variations, the selection of the first state bubble may include placing the first state bubble onto the scaffold and/or dragging the first state bubble within a threshold distance of the scaffold.

In some variations, the first state bubble may be rigidly fixed to the scaffold and/or freely floating with respect to the scaffold subsequent to being attached to the scaffold.

In some variations, the first state bubble and the second state bubble may be replaced with an enumerated state bubble in response to the first state bubble and the second state bubble being selected for encapsulation. In response to the enumerated state bubble being selected for enumeration, a sub-diagram including the first state bubble and the second state bubble may be displayed. In response to the enumerated state bubble being selected for dissolution, the enumerated state bubble may be replaced with the first state bubble and the second state bubble.

In some variations, the state diagram may further include at least one zone identifying one or more transition arrows entering, exiting, and/or self-transitioning at the first state bubble. The zone may include one or more controlled signals associated with programming code.

In some variations, the state diagram may further include at least one macrozone identifying one or more transition arrows entering, existing, and/or self-transitioning at the first state bubble and the second state bubble. The macrozone may include one or more controlled signals associated with programming code.

In some variations, a mousedown event may be detected over a background of the state diagram. A mouseup event over the background of the state diagram may be detected within a threshold quantity of time of the mousedown event. A zoom-to-fit operation with respect to the state diagram may be performed in response to the mouseup event being detected within the threshold quantity of time of the mousedown event.

In some variations, the plurality of graphical elements may include one or more scaffolds, state bubbles, zones, and/or transition arrows. The one or more scaffold may include a circular scaffold, a vertical linear scaffold, a horizontal linear scaffold, and/or an arc scaffold.

Implementations of the current subject matter can include, but are not limited to, systems and methods consistent including one or more features are described as well as articles that comprise a tangibly embodied machine-readable medium operable to cause one or more machines (e.g., computers, etc.) to result in operations described herein. Similarly, computer systems are also described that may include one or more processors and one or more memories coupled to the one or more processors. A memory, which can include a computer-readable storage medium, may include, encode, store, or the like one or more programs that cause one or more processors to perform one or more of the operations described herein. Computer implemented methods consistent with one or more implementations of the current subject matter can be implemented by one or more data processors residing in a single computing system or multiple computing systems. Such multiple computing systems can be connected and can exchange data and/or commands or other instructions or the like via one or more connections, including but not limited to a connection over a network (e.g. the Internet, a wireless wide area network, a local area network, a wide area network, a wired network, or the like), via a direct connection between one or more of the multiple computing systems, etc.

The details of one or more variations of the subject matter described herein are set forth in the accompanying drawings and the description below. Other features and advantages of the subject matter described herein will be apparent from the description and drawings, and from the claims. While certain features of the currently disclosed subject matter are described for illustrative purposes in relation to an enterprise resource software system or other business software solution or architecture, it should be readily understood that such features are not intended to be limiting. The claims that follow this disclosure are intended to define the scope of the protected subject matter.

DESCRIPTION OF DRAWINGS

The accompanying drawings, which are incorporated in and constitute a part of this specification, show certain aspects of the subject matter disclosed herein and, together with the description, help explain some of the principles associated with the disclosed implementations. In the drawings.

When practical, similar reference numbers denote similar structures, features, or elements.

DETAILED DESCRIPTION

To address these and potentially other issues with currently available solutions, methods, systems, articles of manufacture, and the like consistent with one or more implementations of the current subject matter can, among other possible advantages, provide an electronic design automation (EDA) system that simplifies the design of complex electronic circuits. The electronic design automation system can provide a user interface (e.g., a graphic user interface (GUI)) for generating state machine representations of electronic systems such as, for example, integrated circuits (IC). For example, a user can generate, via graphic user interface, a state diagram by adding and/or removing one or more graphical elements including, for example, state bubbles, zones, transition arrows, scaffolds, and/or the like.

In some implementations of the current subject matter, the electronic design automation system can automatically adjust the positions of the graphical elements in a state diagram in response to the addition and/or removal of one or more graphical elements from the state diagram. For instance, the graphical elements can be adjusted in order to maintain a perpendicular and/or centered alignment between the graphical elements. The state machine can further be configured via the graphic user interface including by encapsulating and/or dissolving at least one hierarchical state bubble that correspond to additional state diagrams.

Alternatively and/or additionally, the electronic design automation system can support the designating fault tolerance within an electronic system, such as an integrated circuit, on a microscopic level. It should be appreciated that fault tolerance can refer to the inclusion of one or more redundant elements within at least a portion of an electronic system. Thus, when portions of an electronic system are designated with individual fault tolerance levels, the resulting electronic system can be non-homogenous because the electronic system combines both fault tolerant and non-fault tolerant subsystems. Furthermore, a fully fault tolerant electronic system can support a clairvoyant state machine in which alternate conditions can be evaluated by redundant elements within the fully fault tolerant electronic system.

Figure 1:
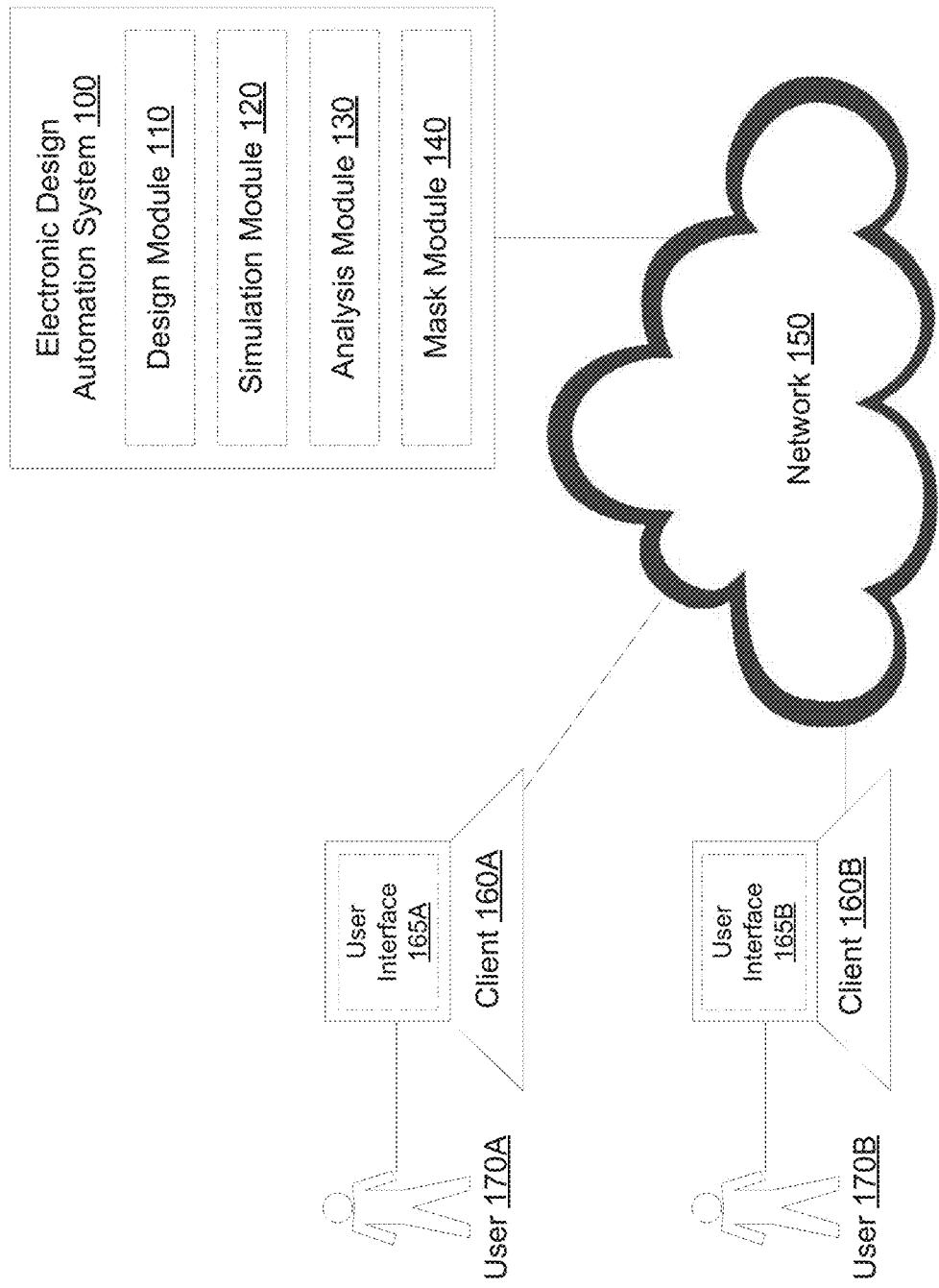
FIG. 1 depicts a system diagram illustrating an electronic design automation system consistent with implementations of the current subject matter.

FIG. 1 depicts a system diagram illustrating an electronic design automation system 100 consistent with implementations of the current subject matter. Referring to FIG. 1, the electronic design automation system 100 can include a design module 110, a simulation module 120, an analysis module 130, and a mask module 140. As shown in FIG. 1, the electronic design automation system 100 can be communicatively coupled, via a network 150, to a plurality of clients including, for example, a first client 160A and/or a second client 160B. The network 150 can be any wired and/or wireless network such as, for example, a public land mobile network (PLMN), a wide area network (WAN), a local area network (LAN), the Internet, and/or the like. The first client 160A and/or the second client 160B can be any type of processor-based device including, for example, a smartphone, a tablet personal computer (PC), a desktop computer, a laptop computer, and/or the like.

In some implementations of the current subject matter, the electronic design automation system 100, for example the designer 110, can be configured to support the design of electronic systems such as, for example, integrated circuits (ICs). For instance, a first user 170A can access the electronic design automation system 100 via the first client 160A while a second user 170B can access the electronic design automation system 100 via the second client 160B. The electronic design automation system 100 can generate a first user interface 165A, which can be a graphic user interface (GUI) displayed at the first client 160A. Alternatively and/or additionally, the electronic design automation system 100 can also generate a second user interface 165B, which can be a graphic user interface displayed at the second client 160B.

The first user 170A can interact with the electronic design automation system 100 via the first user interface 165A while the second user 170B can interact with the electronic design automation system 100 via the second user interface 165B. Here, the first user 170A and/or the second user 170B can interact with the electronic design automation system 100 in order to design electronic systems by at least generating the corresponding state diagram representations. Meanwhile, the simulation module 120 can simulate the electronic systems based on the corresponding state diagram representations while the analysis module 130 can perform a variety of verifications including, for example, functional verification, clock domain crossing verification, formal verification, equivalence checking, state timing analysis, physical verification, and/or the like. Alternatively and/or additionally, the mask module 140 can be configured to translate the state diagram representations of the electronic systems from an integrated circuit layout of the electronic systems to a set of instructions that can be used to manufacture the corresponding physical masks.

In some implementations of the current subject matter, the electronic design automation system 100 can be deployed as a cloud-based service. Thus, as shown in FIG. 1, one or more functionalities of the electronic design automation system 100 can be accessed remotely, for example, via the network 150. However, it should be appreciated that the electronic design automation system 100 can also be deployed as computer software and/or dedicated circuitry (e.g., application specific integrated circuits (ASICs)) at the first client 160A and/or the second client 160B such that the functionalities of the electronic design automation system 100 are available locally at the first client 160A and/or the second client 160B.

As noted, the electronic design automation system 100 can support the design of electronic systems (e.g., integrated circuits) by at least providing user interfaces (e.g., the first user interface 165A and/or the second user interface 165B) that enable the generation of state diagram representations of the electronic systems. In some implementations of the current subject matter, these user interfaces can provide a palette of graphical elements that can be used to form a state diagram. These graphical elements can include, for example, state bubbles, zones, transition arrows, scaffolds, and/or the like. It should be appreciated that a state diagram can be generated by at least placing, along one or more scaffolds, a plurality of state bubbles, transitions arrows, and/or zones.

In some implementations of the current subject matter, a state diagram can be generated by adding and/or removing one or more scaffolds. Generating the state diagram further includes attaching, to the scaffolds, other graphical elements such as, for example, state bubbles, transition arrows, zones, and/or the like. Graphical elements such as state bubbles and transition arrows can have an affinity for a scaffold such that dragging a graphical element from the palette onto the scaffold and/or within a threshold distance of the scaffold can automatically attach the graphical element to the scaffold. It should be appreciated that graphical elements attached to the scaffold can either float freely and/or remain rigidly fixed to the scaffold. Moreover, the scaffolds can be oriented, moved, and/or resized as desired. A graphical element that is not dragged onto the scaffold and/or within a threshold distance of the scaffold can be placed at and/or near the location to which the graphical element is dragged.

According to some implementations of the current subject matter, the electronic design automation system 100 can be configured to dynamically adjust a dimension (e.g., diameter, length, and/or the like) of the scaffold in order to accommodate the addition and/or deletion of objects along the scaffold. For example, the electronic design automation system 100 can respond to the removal of one or more state bubbles and/or transition arrows by contracting the scaffold. Alternatively and/or additionally, the electronic design automation system 100 can respond to the addition of one or more state bubbles and/or transition arrows by expanding the scaffold.

Figure 2A:
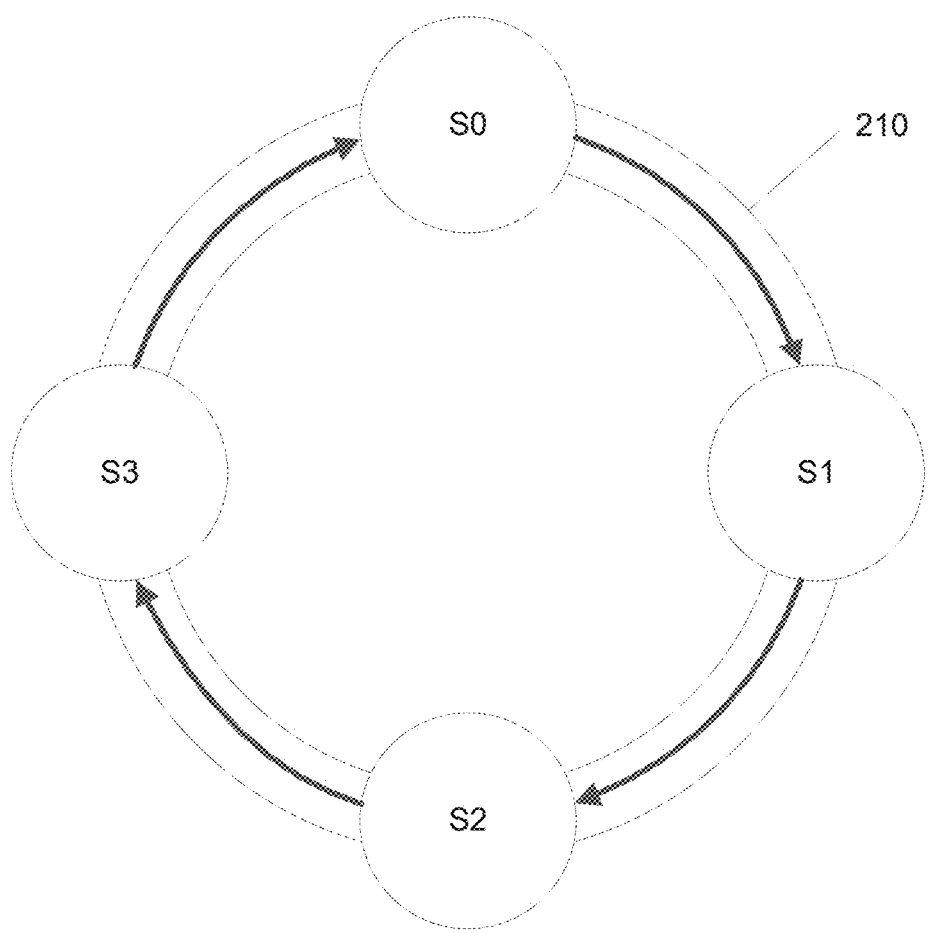
FIG. 2A depicts a user interface displaying a circular scaffold consistent with implementations of the current subject matter.
Figure 2B:
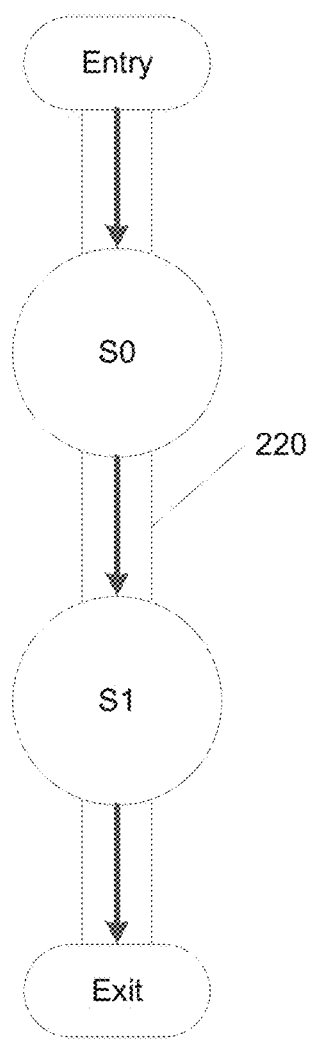
FIG. 2B depicts a user interface displaying a vertical linear scaffold consistent with implementations of the current subject matter.
Figure 2C:
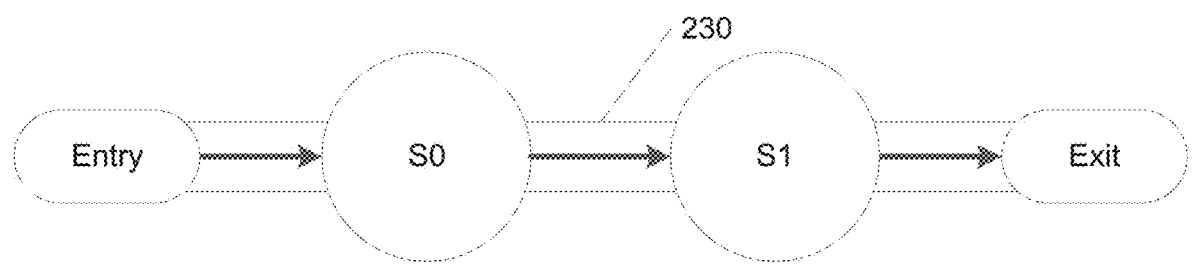
FIG. 2C depicts a user interface displaying a horizontal linear scaffold consistent with implementations of the current subject matter.
Figure 2D:
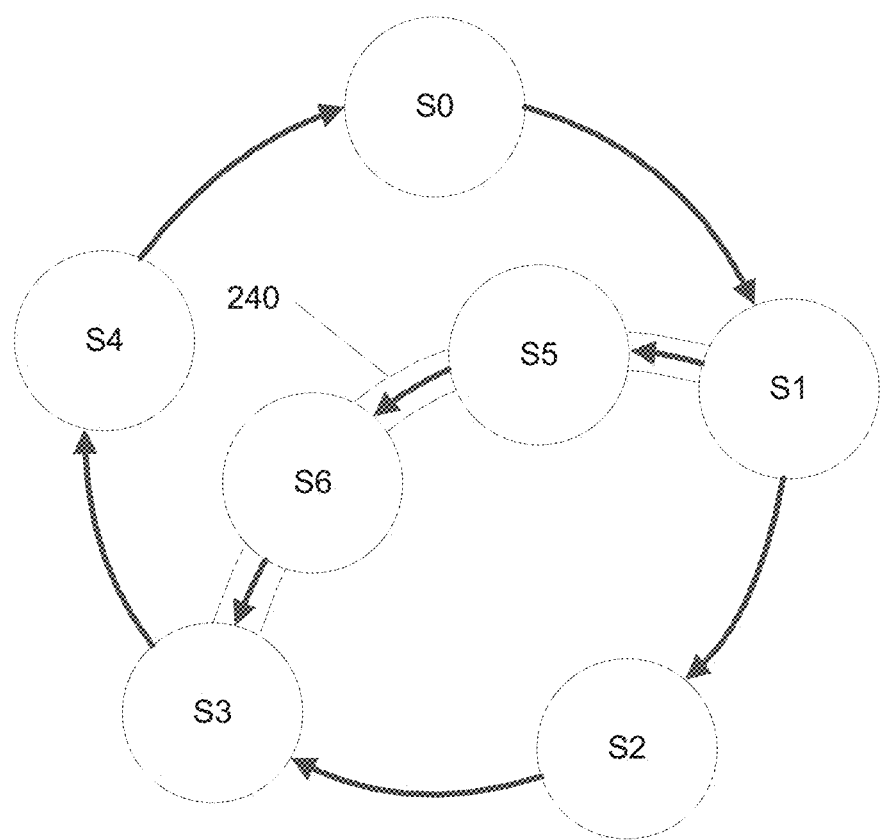
FIG. 2D depicts a user interface displaying an arc scaffold consistent with implementations of the current subject matter.

The electronic design automation system 100 can provide a variety of scaffolds, which can be selected from a palette of available graphical elements. For example, FIG. 2A depicts user interface displaying a circular scaffold 210 consistent with implementations of the current subject matter. Meanwhile, FIG. 2B depicts a user interface displaying a vertical linear scaffold 220 consistent with implementations of the current subject matter. FIG. 2C depicts a user interface displaying a horizontal linear scaffold 230 consistent with implementations of the current subject matter. FIG. 2D depicts a user interface displaying an arc scaffold 240 consistent with implementations of the current subject matter. As shown in FIG. 2A-D, one or more state bubbles and/or transition arrows can be placed along a scaffold such as, for example, the circular scaffold 210, the vertical linear scaffold 220, the horizontal linear scaffold 230, and/or the arc scaffold 240. Although not shown, it should be appreciated that scaffolds can be multidimensional. For example, a three-dimensional scaffold can be, for example, a sphere, a cube, and/or the like.

The transition between states can be represented by one or more transition arrows. In some implementations of the current subject matter, the electronic design automation system 100 can support the addition of zones to a state diagram. As used herein, a zone can identify a group of transition arrows that is associated with a state bubble, for example, by entering, exiting, and/or self-transitioning with respect to that state bubble. A zone can graphically represent elements that are managed and/or controlled based on an entry, exit, and/or self-transition with respect to a single state bubble. For instance, a zone can graphically represent a set of controlled signals that are managed and/or controlled based on entries, exits, and/or self-transitions with respect to a single state bubble. A controlled signal can be associated with a set of programming code. The programming code can declare a data type and/or define a functionality of the controlled signal. Alternatively and/or additionally, the programming code can reference and/or enable the reference of the controlled signal.

Figure 3A:
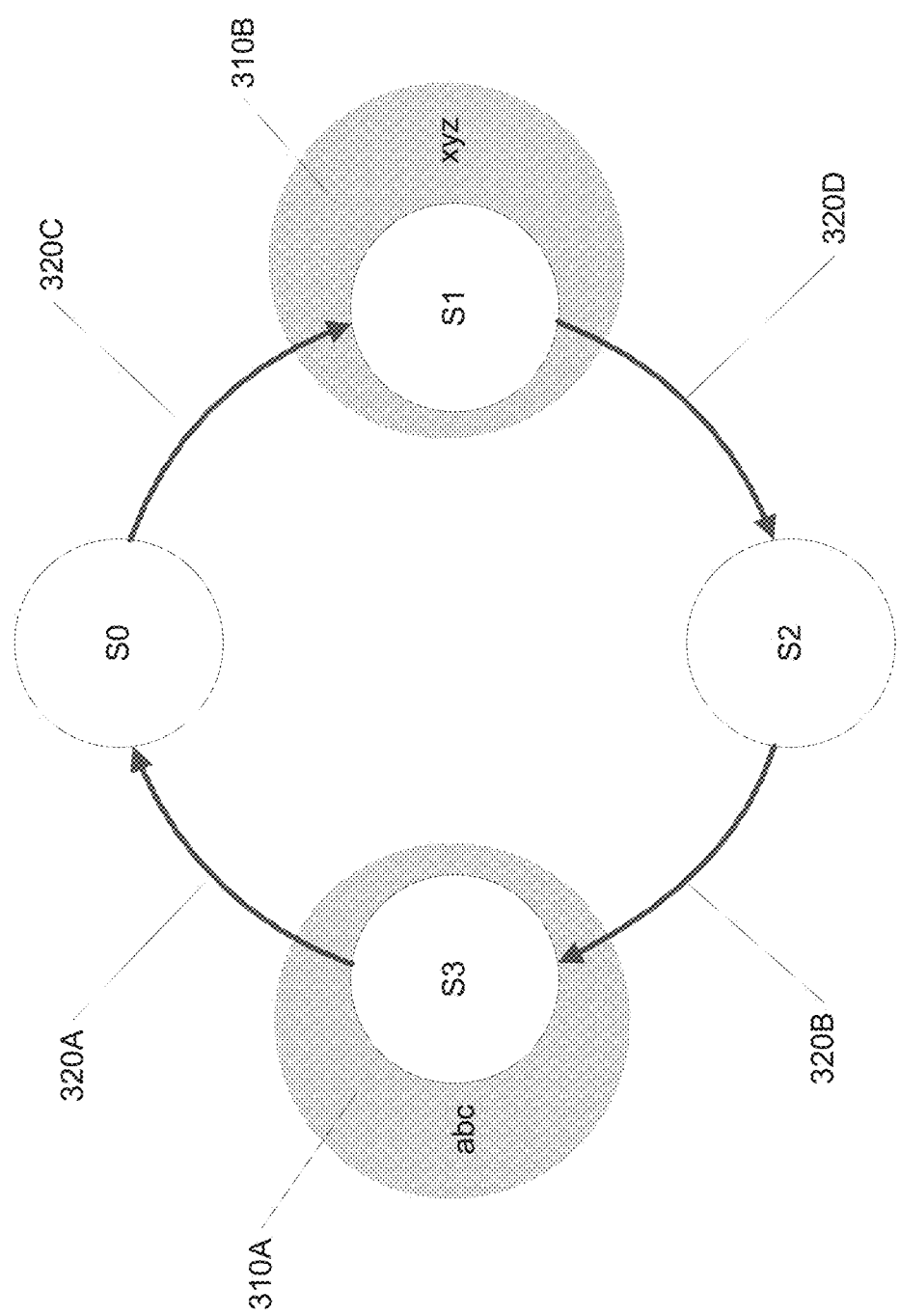
FIG. 3A depicts a user interface displaying first zone and a second zone consistent with implementations of the current subject matter.

To further illustrate, FIG. 3A depicts a user interface displaying a first zone 310A and a second zone 310B consistent with implementations of the current subject matter. The first zone 310A can be associated with the state bubble S3 while the second zone 310B can be associated with the state bubble S1. As shown in FIG. 3A, the first zone 310A can identify a plurality of transition arrows associated with the state bubble S3 including, for example, a first transition arrow 320A exiting the state bubble S3 and a second transition arrow 320B entering the state bubble S3. Furthermore, the first zone 310A can include one or more controlled signals including, for example, a controlled signal abc. Meanwhile, the second zone 310B can identify a plurality of transition arrows associated with the state bubble S1 including, for example, a third transition arrow 320C entering the state bubble S1 and a fourth transition arrow 320D exiting the state bubble S1. The second zone 310B can further include one or more controlled signals, including, for example, a controlled signal xyz.

In some implementations of the current subject matter, the electronic design automation system 100 can further support the addition of macrozones to a state diagram. For example, a macrozone can identify a group of transition arrows associated with multiple state bubbles, for example, by entering, exiting, and/or self-transitioning with respect to these state bubbles. A macrozone can graphically represent controlled signals that are managed and/or controlled based on one or more entries, exits, and/or self-transitions with respect to multiple state bubbles. Each macrozone can also include one or more macro-controlled signals. A macro-controlled signal can also be associated with a set of programming code. The programming code can declare a data type and/or define a functionality of the macro-controlled signal. Alternatively and/or additionally, the programming code can reference and/or enable the reference of the macro-controlled signal.

Figure 3B:
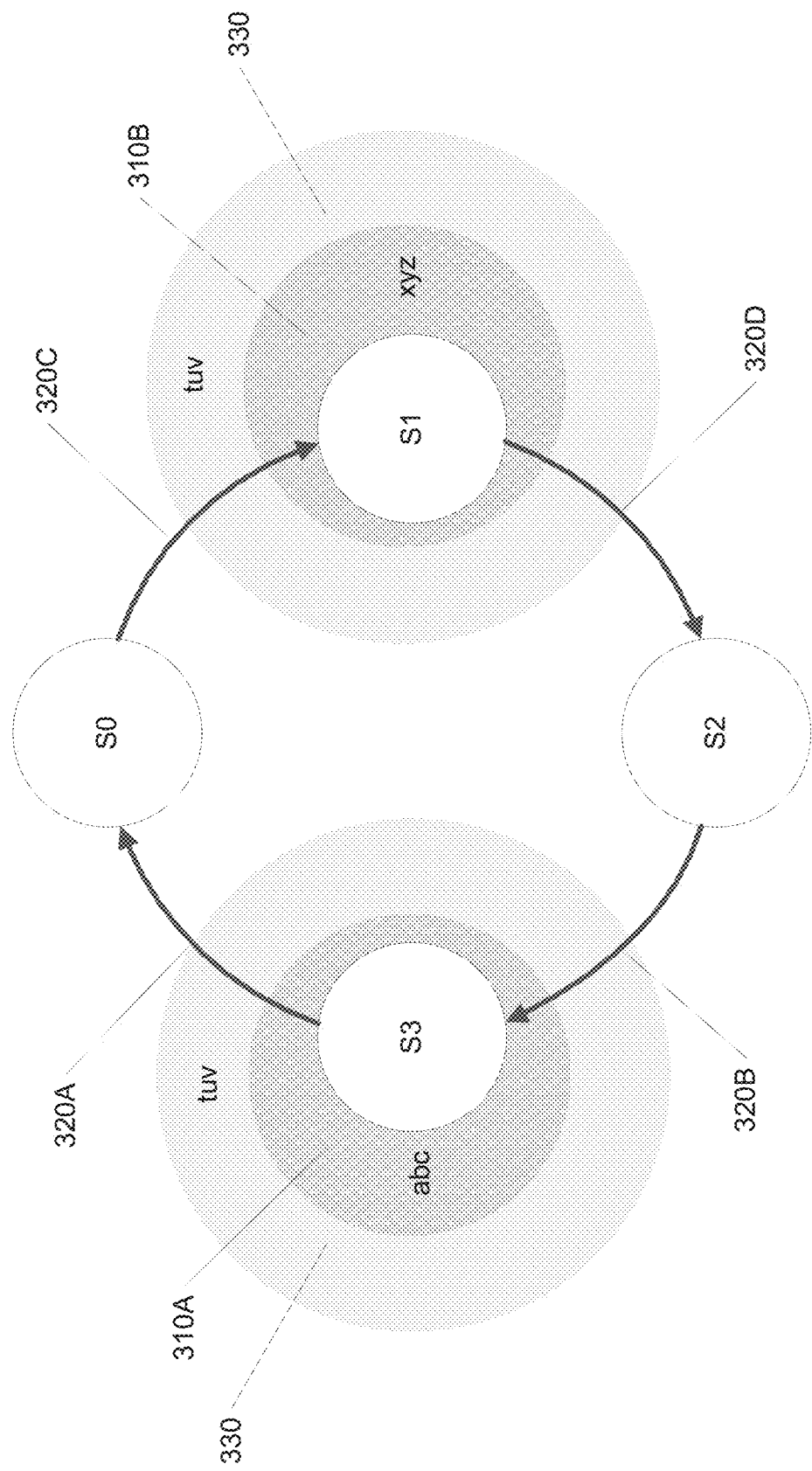
FIG. 3B depicts a user interface displaying a macrozone consistent with implementations of the current subject matter.

To further illustrate, FIG. 3B depicts a user interface displaying a macrozone 330 consistent with implementations of the current subject matter. The macrozone 330 can be associated with multiple state bubbles including, for example, the state bubble S1 and the state bubble S3. As such, the macrozone 330 can identify a plurality of transition arrows associated with both the state bubble S1 and the state bubble S3. For example, the macrozone 330 can identify the first transition arrow 320A exiting the state bubble S3, the second transition arrow 320B entering the state bubble S3, the third transition arrow 320C entering the state bubble S1, and the fourth transition arrow 320D exiting the state bubble S1. The macrozone 330 can further include one or more controlled signals including, for example, a macro-controlled signal tuv. According to some implementations of the current subject matter, selecting the macro-controlled signal tuv can cause the macrozone 330 to become visually highlighted in a graphic user interface generated by the electronic design automation system 100. By contrast, deselecting the macro-controlled signal tuv can remove the visual highlighting of the macrozone 330 in the graphic user interface generated by the electronic design automation system 100.

In some implementations of the current subject matter, the electronic design automation system 100 can automatically adjust the positions of the graphical elements in a state diagram in order to maintain a perpendicular and/or centered alignment between the graphical elements. For example, the positions of one or more state bubbles can be adjusted such that the transition arrows intersect the state bubbles perpendicularly and traverse along a centerline of the scaffolds. The positions of the state bubbles can be adjusted by at least moving the state bubbles that lie along a scaffold such as, for example, a circular scaffold (e.g., the circular scaffold 210) and/or an arc scaffold (e.g., the arc scaffold 240). For instance, these state bubbles can be moved outward and away from a center point of the scaffold until the center points of the state bubbles lie outside of the centerline of the scaffold.

Figure 4:
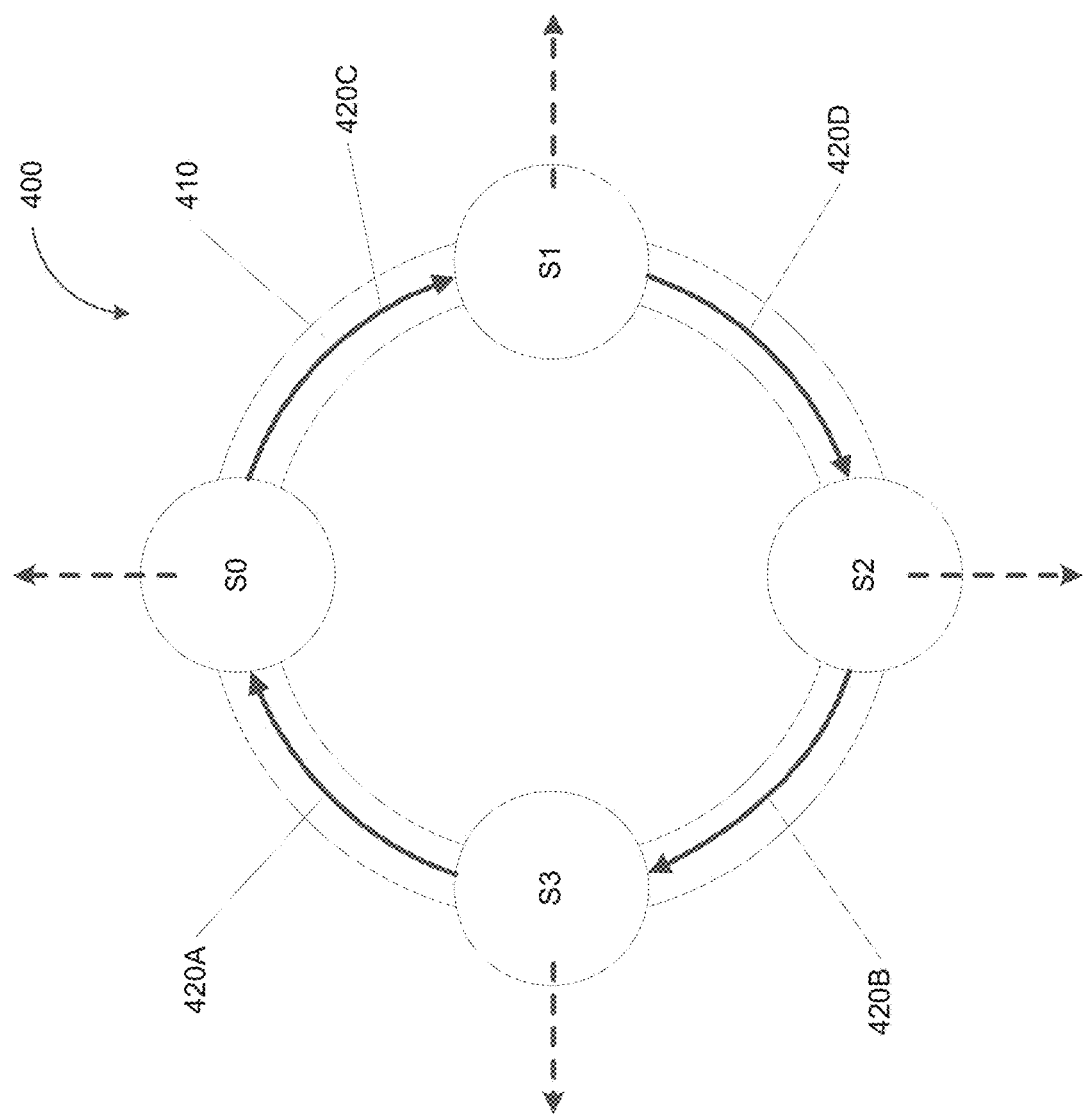
FIG. 4 depicts an adjustment to the positions of state bubbles in a state diagram consistent with implementations of the current subject matter.

To further illustrate, FIG. 4 depicts an adjustment to the positions of state bubbles in a state diagram 400 consistent with implementations of the current subject matter. As shown in FIG. 4, the state diagram 400 can include a plurality of state bubbles including, for example, a state bubble S1, a state bubble S2, a state bubble S3, and a state bubble S4. The state bubble S1, the state bubble S2, the state bubble S3, and the state bubble S4 can be attached (e.g., freely floating and/or rigidly fixed) to a circular scaffold 410. Furthermore, the state diagram 400 can include a plurality of transition arrows linking these state bubbles including, for example, a first transition arrow 420A, a second transition arrow 420B, a third transition arrow 420C, and a fourth transition arrow 420C. In some implementations of the current subject matter, the electronic design automation system 100 can adjust the positions of the state bubble S1, the state bubble S2, the state bubble S3, and/or the state bubble S4 including by moving the state bubble S1, the state bubble S2, the state bubble S3, and/or the state bubble S4 outward and away from a center point of the circular scaffold 410 until the center points of the state bubble S1, the state bubble S2, the state bubble S3, and the state bubble S4 lie outside of a centerline of the circular scaffold 410. In the resulting state diagram 400, the first transition arrow 420A, the second transition arrow 420B, the third transition arrow 420C, and the fourth transition arrow 420C can lie along the centerline of the circular scaffold 410, and intersect the state bubble S1, the state bubble S2, the state bubble S3, and/or the state bubble S4 perpendicularly.

It should be appreciated that the distance and the direction for moving a state bubble can be a function of a radius of the state bubble, a radius of the scaffold, and a position of the state bubble along the scaffold. For example, the distance d for moving a state bubble can be determined based on Equation (1) below:

$$d = \sqrt{R^2 + r^2} - R \qquad (1)$$

wherein R may be the radius of the scaffold and r may be the radius of the state bubble.

The direction for moving the state bubble along a horizontal axis can be determined based on the following Equation (2):

$$dx = d \times \cos(\theta) \qquad (2)$$

wherein d may be the distance for moving the state bubble and θ may be an angle of the state bubble relative to a center point of the scaffold and the positive horizontal axis.

Meanwhile, the direction for moving the state bubble along a vertical axis can be determined based on the following Equation (3):

$$dy = -d \times \sin(\theta) \qquad (3)$$

wherein d may be the distance for moving the state bubble and θ may be an angle of the state bubble relative to the center point of the scaffold and the positive horizontal axis.

Table 1 below depicts programming code implementing the automatic adjustment of the positions of state bubbles with in a state diagram.

TABLE 1

```
function setStatePerpendicularOffset (s, r_sw) {
    var angle = s.data ('theta'),
    rs = getStateRadius (s),
    d_offset = Math.sqrt (r_sw * r_sw + rs * rs) - r_sw,
    x_d = d_offset * Math.cos(angle),
    y_d = -d_offset * Math.sin(angle);
```

TABLE 1-continued

```
    s.data ({
        adj_x: x_d,
        adj_y: y_d
    });
    s = s[0];
    s.adjusted = true;
    s.adjusting = true; // how to tell if adj animation is in progress
    s.adj_x = x_d;
    s.adj_y = y_d;
}
```

As noted, transition arrows can be interposed between state bubbles. That is, a single transition arrow can intersect a pair of state bubbles as it exits a starting point state bubble and enters an endpoint state bubble. For instance, as shown in FIG. 4, the first transition arrow 420A can intersect the state bubble S0 and the state bubble S3, the second transition arrow 420B can intersect the state bubble S2 and the state bubble S3, the third transition arrow 420C can intersect the state bubble S0 and the state bubble S1, and the fourth transition arrow 420D can intersect the state bubble S1 and the state bubble S2. In some implementations of the current subject matter, the electronic design automation system 100 can determine the position of a transition arrow such that it intersects both its starting point state bubble and its endpoint state bubble perpendicularly.

Figure 5B:
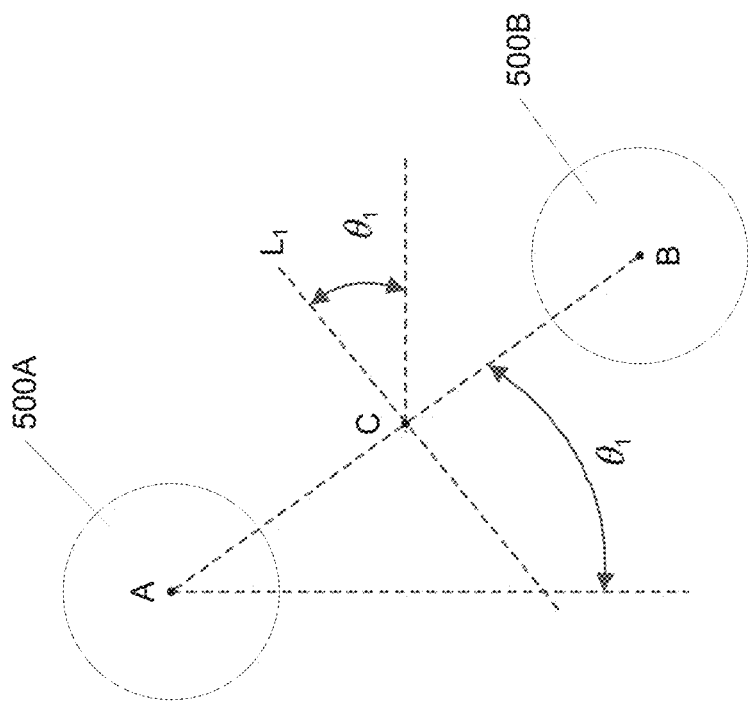
FIG. 5B depicts orthogonal circle math consistent with implementations of the current subject matter.
Figure 5A:
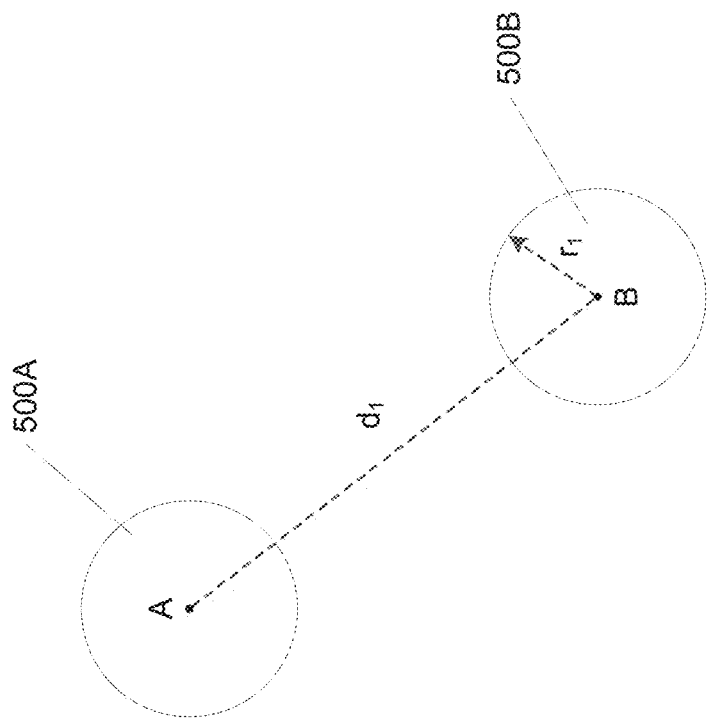
FIG. 5A depicts orthogonal circle math consistent with implementations of the current subject matter.

To further illustrate, FIG. 5A depicts orthogonal circle math consistent with implementations of the current subject matter. As shown in FIG. 5A, a first state bubble 500A can have a center point A and a second state bubble 500B can have a center point B. Meanwhile, both the first state bubble 500A and the second state bubble 500B can have a radius of $r_1$. The distance $d_1$ between the center points A and B can be determined based on the following equation (4):

$$d_1 = \sqrt{(B_x - A_x)^2 + (B_y - A_y)^2} \qquad (4)$$

wherein $A_x$ may be the x-coordinate of the center point A, $A_y$ may be the y-coordinate of the center point A, $B_x$ may be the x-coordinate of the center point B, and $A_y$ may be the y-coordinate of the center point B.

FIG. 5B depicts orthogonal circle math consistent with implementations of the current subject matter. Referring to FIGS. 5A-B, the x-coordinate $C_x$ and the y-coordinate $C_y$ of the halfway point C between center point A of the first state bubble 500A and the center point B of the second state bubble 500B can be determined based on the following Equations (5) and (6):

$$C_x = \frac{A_x + B_x}{2} \qquad (5)$$

$$C_y = \frac{A_y + B_y}{2} \qquad (6)$$

Furthermore, the angle $\theta_1$ with respect to a centerline $L_1$ traversing the halfway point C perpendicularly can be determined based on Equation (7) below. It should be appreciated that the angle $\theta_1$ can correspond to an offset between the center point A of the first state bubble 500A and the center point B of the second state bubble 500B.

$$\theta_1 = \tan^{-1}\left(\frac{B_x - A_x}{B_y - A_y}\right) \qquad (7)$$

Figure 5C:
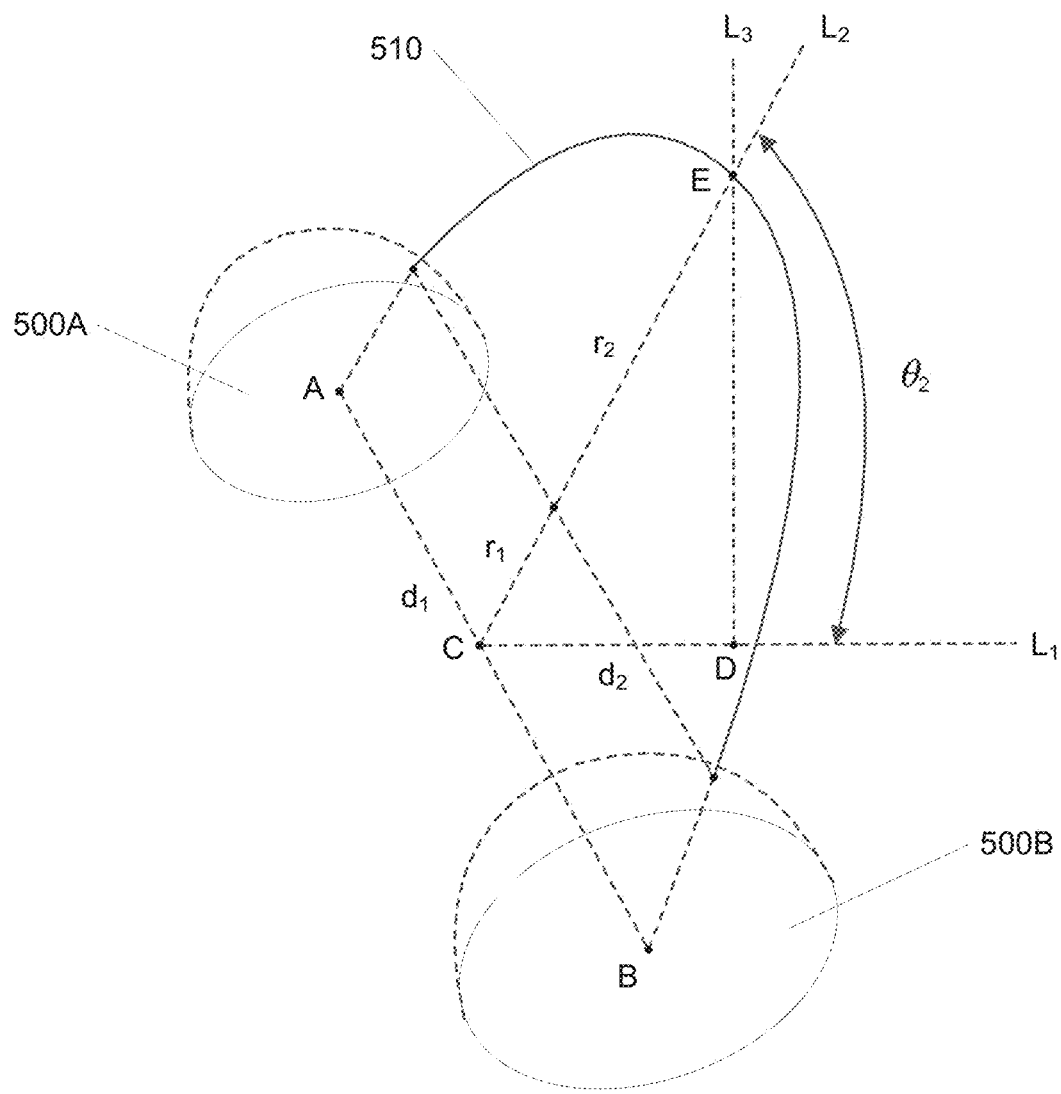
FIG. 5C depicts orthogonal circle math consistent with implementations of the current subject matter.

FIG. 5C depicts orthogonal circle math consistent with implementations of the current subject matter. Referring to FIGS. 5A-C, the radius $r_2$ of a semi-circular arc 510 perpendicularly connecting the surface of a spherical equivalent of the first state bubble 500A and the surface of a spherical equivalent of the second state bubble 500B in three-dimensional space can be determined based on the following equation (8):

$$r_2 = \frac{d_1}{2} \quad (8)$$

Meanwhile, a distance $d_2$ between the projection of the point H that is on the semi-circular arc 510 and the perpendicular centerline $L_1$ traversing the halfway point C between the center points A and B can be determined based on Equation (9) below:

$$d_2 = (r_1 + r_2)\cos(\theta_2) \quad (9)$$

wherein the angle $\theta_2$ may be the angle formed by the centerline $L_1$ traversing the halfway point C and another centerline $L_2$ that traverses both the halfway point C and the semi-circular arc 510.

Referring again to FIGS. 5A-C, the x-coordinate $D_x$ and the y-coordinate $D_y$ of a point D can be determined based on Equations (10) and (11) below. It should be appreciated that the point D is a point on the centerline $L_1$ that lies directly beneath point E at which the other centerline $L_2$ traverses the semi-circular arc 510. As shown in FIG. 5C line $L_3$ that traverses both points D and E can be perpendicular to the centerline $L_1$.

$$D_x = C_x + d_2 \cos(\theta_1) \quad (10)$$

$$D_y = C_y + d_2 \sin(\theta_1) \quad (11)$$

Figure 5D:
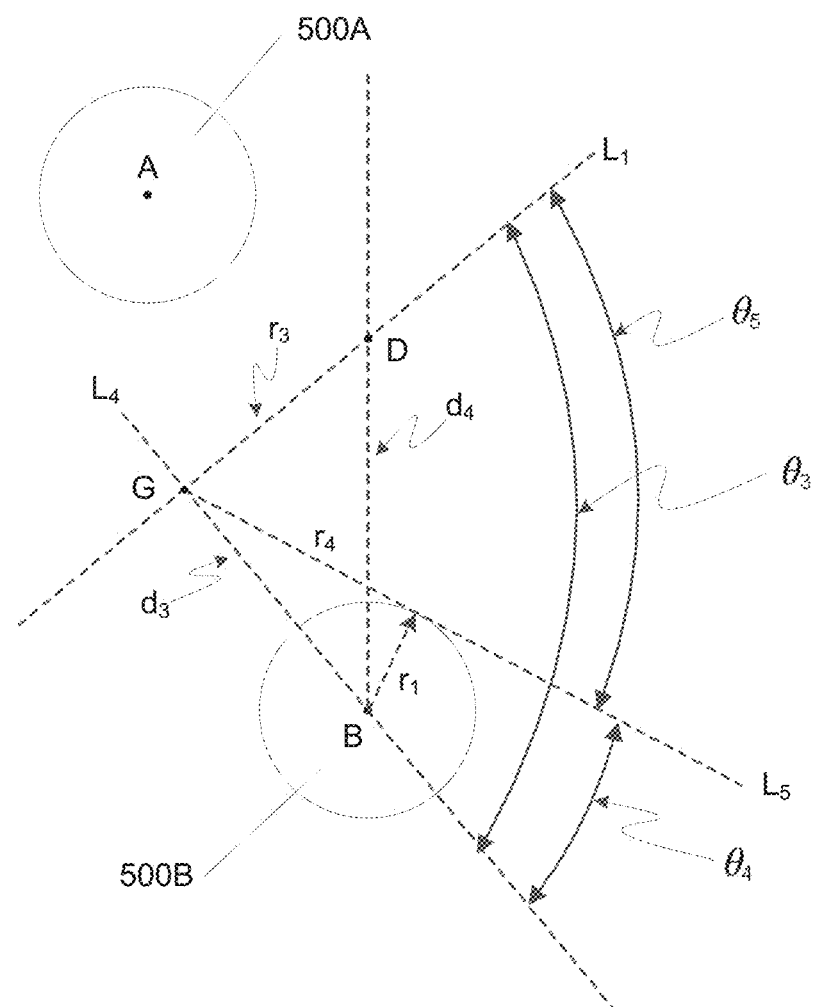
FIG. 5D depicts orthogonal circle math consistent with implementations of the current subject matter.

FIG. 5D depicts orthogonal circle math consistent with implementations of the current subject matter. Referring to FIGS. 5A-D, the x-coordinate $G_x$ and the y-coordinate $G_y$ of a point G on the centerline $L_1$ can be determined based on Equations (12) and (13) below.

$$G_x = D_x - r_3 \cos(\theta_1) \quad (12)$$

$$G_y = D_y - r_3 \sin(\theta_1) \quad (13)$$

wherein $r_3$ may be a distance between the points D and G along the centerline $L_1$.

Meanwhile, a distance $d_3$ between the point G and the center point B of the second state bubble 500B can be determined based on Equation (14) below. It should be appreciated that a line $L_4$ intersecting both the point G and the center point B can be perpendicular to the centerline $L_1$.

$$d_3 = \sqrt{(B_x - G_x)^2 + (B_y - G_y)^2} \quad (14)$$

$$d_3 = \sqrt{B_x^2 - 2B_x G_x + G_x^2 + B_y^2 - 2B_y G_y + G_{y2}}$$

$$d_3 = \sqrt{\begin{array}{l} B_x^2 - 2B_x(D_x - r_3\cos(\theta_1)) + (D_x - r_3\cos(\theta_1))^2 + \\ B_y^2 - 2B_y(D_y + r_3\sin(\theta_1)) + (D_y + r_3\sin(\theta_1))^2 \end{array}}$$

$$d_3 = \sqrt{\begin{array}{l} B_x^2 - 2B_x D_x + 2B_x r_3\cos(\theta_1) + D_x^2 - 2D_x r_3\cos(\theta_1) + \\ r_3^2\cos^2(\theta_1) + B_y^2 - 2B_y D_y - 2B_y r_3\sin(\theta_1) + D_y^2 + \\ 2D_y r_3\sin(\theta_1) + r_3^2\sin^2(\theta_1) \end{array}}$$

It should be appreciated that for every point G, there exists a line $L_5$ which intersects the centerline $L_1$ at the point G and is tangent to the second state bubble 500B. The distance between the point G and a point at which the line $L_5$ is tangent to the second state bubble 500B can be denoted by the radius $r_4$. The radius $r_4$ can be determined based on the following Equation (15):

$$r_4^2 + r_1^2 = d_3^2$$

$$r_4 = \sqrt{d_3^2 - r_1^2} \quad (15)$$

In some implementations of the current subject matter, the value for the radius $r_3$ is determined for when the radius $r_3$ and the radius $r_4$ are set equal.

$$r_3 = r_4$$

$$r_3 = \sqrt{d_3^2 - r_1^2}$$

$$r_3 = \sqrt{ar_3^2 + br_3 + c_2} - r_1^2$$

$$r_3^2 = ar_3^2 + br_3 + c - r_1^2$$

$$r_3^2 - ar_3^2 - br_3 = c - r_1^2$$

$$(1-a)r_3^2 - br_3 = c - r_1^2$$

$$-br_3 = c - r_1^2$$

$$r_3 = \frac{c - r_1^2}{-b}$$

$$r_3 = \frac{r_1^2 - c}{b}$$

With reference to FIGS. 5A-D, the distance $d_4$ between the point D and the center point B of the second state bubble 500B can be determined based on the following Equation (16):

$$d_4 = \sqrt{(B_x - D_x)^2 + (B_y - D_y)^2} \quad (16)$$

The angle $\theta_3$ formed by the center line $L_1$ and the line $L_4$ traversing through both the point G and the center point B of the second state bubble 500B can be determined based on the following equation (17):

$$\theta_3 = \cos^{-1}\left(\frac{r_3^2 + d_3^2 - d_4^2}{2r_3 d_3}\right) \quad (17)$$

The angle $\theta_4$ formed by the lines $L_4$ and $L_5$ tangent to the second state bubble 500B can be determined based on the following equation (18):

$$\theta_4 = \tan^{-1}\left(\frac{r_1}{r_3}\right) \quad (18)$$

Meanwhile, the angle $\theta_5$ formed by the center line $L_1$ and the line $L_5$ can be determined based on the following equation (19):

$$\theta_5 = \theta_3 - \theta_4 \quad (19)$$

Figure 5E:
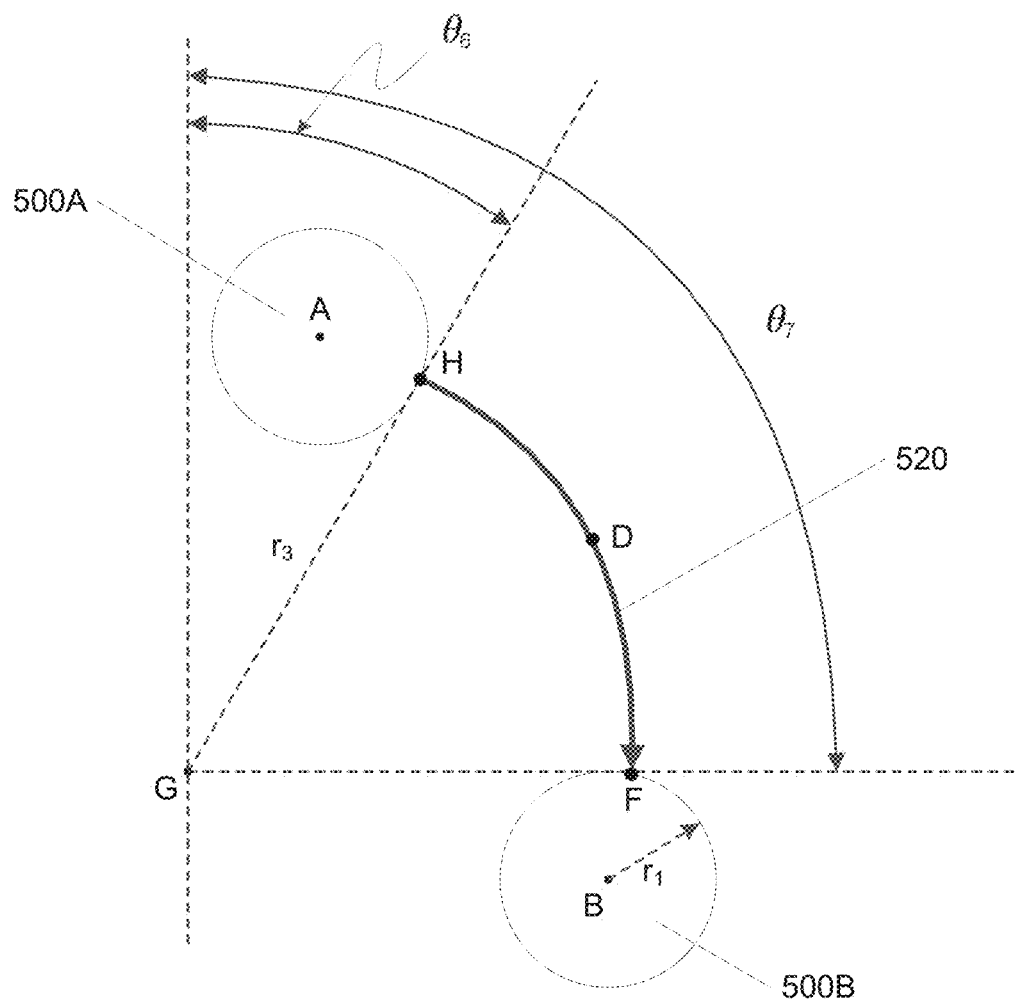
FIG. 5E depicts orthogonal circle math consistent with implementations of the current subject matter.

FIG. 5E depicts orthogonal circle math consistent with implementations of the current subject matter. Referring to FIG. 5E, given the x-coordinates and the y-coordinates of the center point A of the first state bubble 500A and the center point B of the second state bubble 500B, the radius $r_1$ of the first state bubble 500A and the second state bubble 500B, and the angle $\theta_2$, the electronic design automation system 100 can determine the x-coordinates and the y-coordinates of a point H along a perimeter of the first state bubble 500A where a transition arrow 520 should intersect the first state bubble 500A. Alternatively and/or additionally, the electronic design automation system 100 can determine the x-coordinates and the y-coordinates of a point F along a perimeter of the second state bubble 500B where the transition arrow 520 should intersect the second state bubble 500B. It should be appreciated that the transition arrow 520 can intersect the first state bubble 500A and the second state bubble 500B at the points E and F perpendicularly. Furthermore, the point D can correspond to a highest point of the circular arc formed by the transition arrow 520.

Referring to FIGS. 5D-E, the angle $\theta_6$ can be determined based on the following Equation (20):

$$\theta_6 = 90° - \theta_1 - \theta_5 \tag{20}$$

Meanwhile, the angle $\theta_7$ can be determined based on the following Equation (21):

$$\theta_7 = 90° - \theta_1 + \theta_5 \tag{21}$$

Figure 6A:
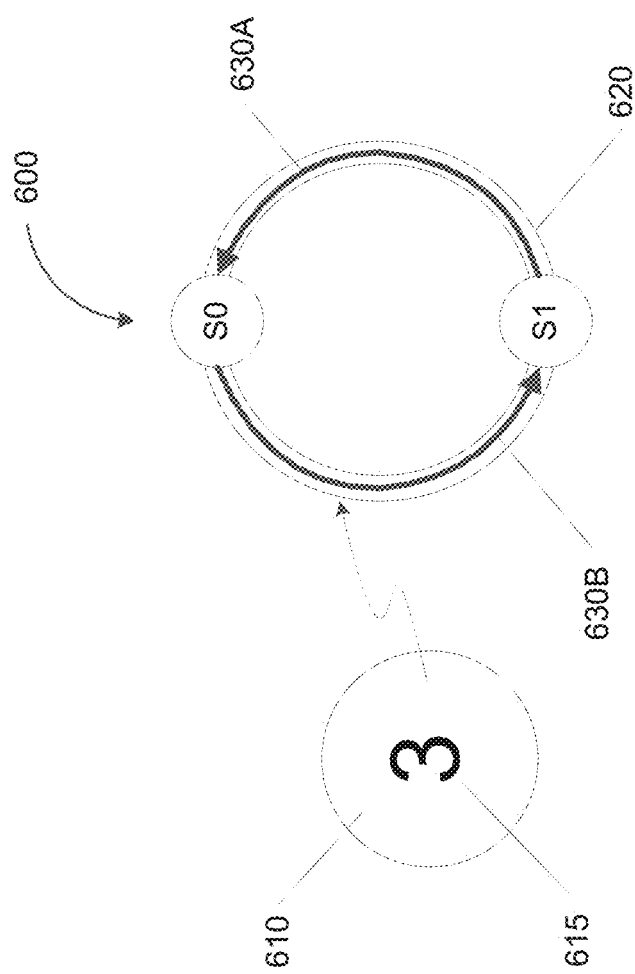
FIG. 6A depicts a user interface displaying a multi-drop of state bubbles consistent with implementations of the current subject matter.
Figure 6B:
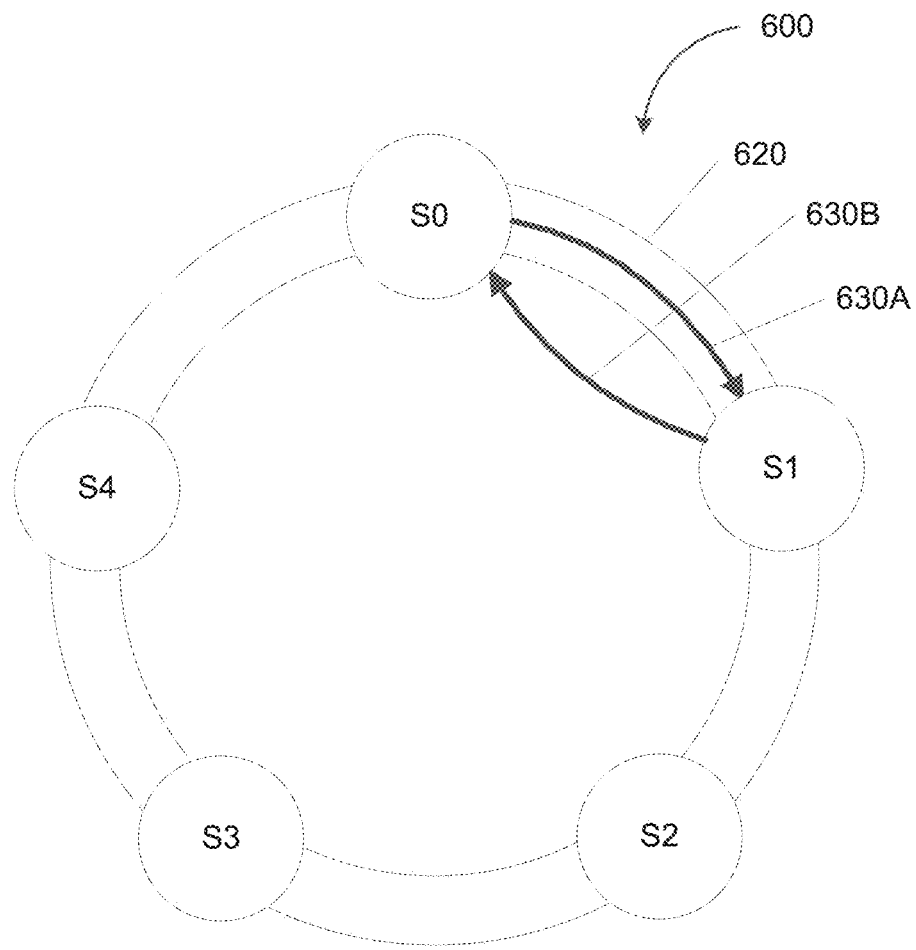
FIG. 6B depicts a user interface displaying a multi-drop of state bubbles consistent with implementations of the current subject matter.

In some implementations of the current subject matter, the electronic design automation system 100 can provide a multi-drop feature that enables a simultaneous insertion of multiple state bubbles into a state diagram. To further illustrate, FIGS. 6A-B depict user interfaces displaying a multi-drop of state bubbles consistent with implementations of the current subject matter. Referring to FIG. 6A, a user (e.g., the first user 170A and/or the second user 170B) can initiate a multi-drop of two or more state bubbles by selecting a state bubble 610, for example, from a user interface displaying a palette of available graphical elements. It should be appreciated that the user can insert the state bubble 610 into a state diagram 600 by at least dragging the state bubble 610 onto the state diagram 600. The state diagram 600 can include a scaffold 620 as well as one or more existing state bubbles such as, for example, a state bubble S0 and a state bubble S1. Dragging the state bubble 610 onto the scaffold 620 and/or within a threshold distance of the scaffold 620 can cause at least one additional state bubble to be automatically attached to the scaffold 620.

Referring again to FIG. 6A, the state bubble 610 can display a numerical value 615 (e.g., an integer) corresponding to a quantity of state bubbles that are to be multi-dropped onto the scaffold 620 when the state bubble 610 is added to the state diagram 600, for example, by dragging the state bubble 610 onto the scaffold 620 and/or within a threshold distance of the scaffold 620. The user can adjust this numerical value 615 in order to adjust the quantity of state bubbles that are attached to the scaffold 620 based on the addition of the state bubble 610. As shown in FIG. 6A, the numerical value 615 is "3." Accordingly, the electronic design automation system 100 can respond to the state bubble 610 being dragged onto the scaffold 620 and/or within a threshold distance of the scaffold 620 by attaching three state bubbles onto the scaffold 620, including, for example, a state bubble S2, a state bubble S3, and a state bubble S4. To further illustrate, FIG. 6B depicts the state diagram 600 after the state bubble 610 is dragged onto the scaffold 620 and/or within a threshold distance of the scaffold 620. As shown in FIG. 6B, dragging the state bubble 610 onto the scaffold 620 and/or within the threshold distance of the scaffold 620 can result in the attachment of the state bubble S2, the state bubble S3, and the state bubble S4 onto the scaffold 620. It should be appreciated that the electronic design automation system 100 can automatically adjust a dimension of the scaffold 620 and/or the positions of the state bubbles on the scaffold 620 such that the state bubble S0, the state bubble S1, the state bubble S2, the state bubble S3, and the state bubble S4 are spaced evenly along the scaffold 620.

In some implementations of the current subject matter, the electronic design automation system 100 can be configured to automatically daisy chain two or more state bubbles that have been attached to a scaffold of a state diagram. For example, the electronic design automation system 100 can daisy chain two or more state bubbles by automatically inserting transition arrows that directionally connecting the state bubbles. The direction of the transition arrows can be determined based on the scaffold and/or the direction of any existing transition arrows. The resulting daisy chain of state bubbles can bifurcate and/or confluence in a manner that is consistent with the scaffold and/or the existing transition arrows in the state diagram.

Figure 6C:
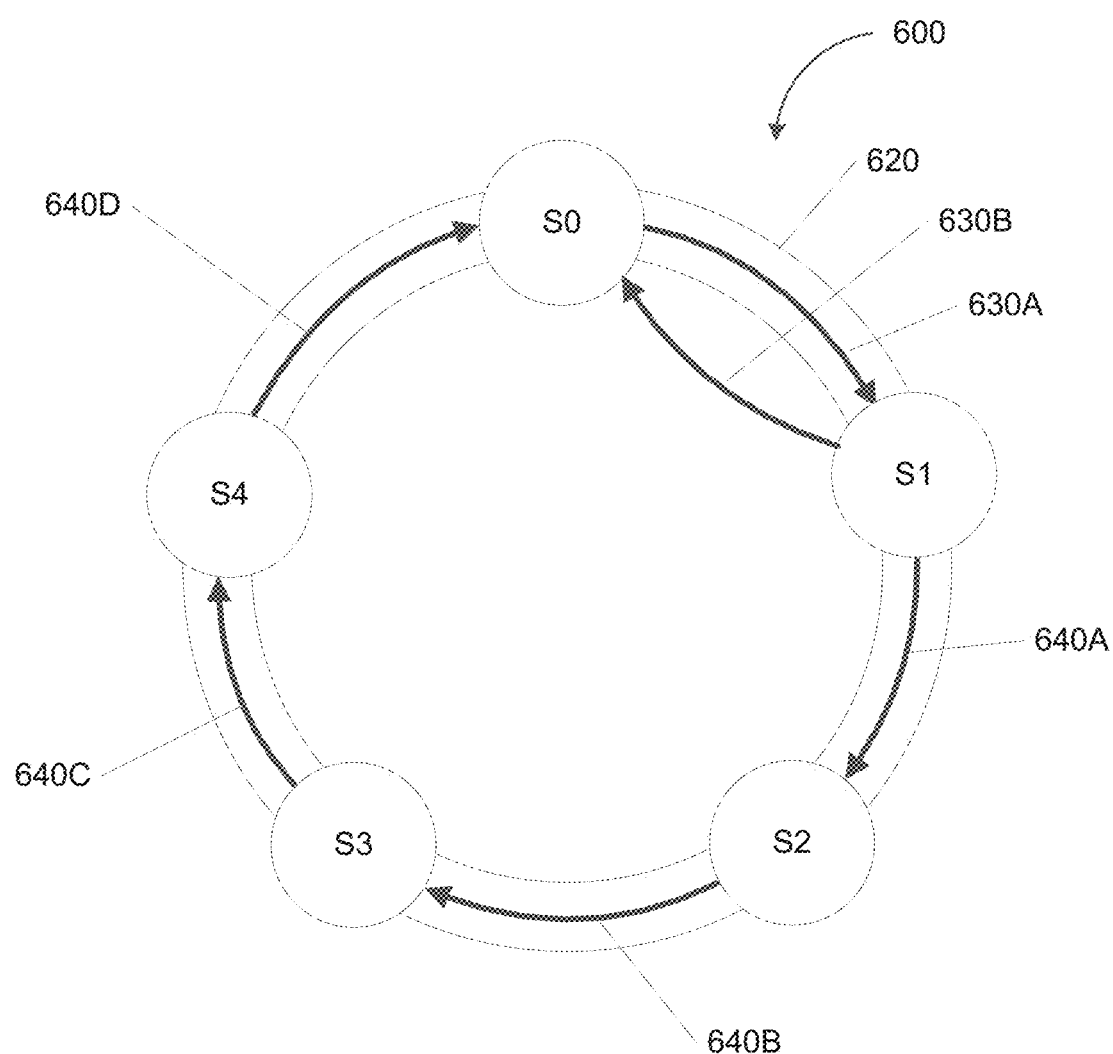
FIG. 6C depicts a user interface displaying a daisy chaining of state bubbles consistent with implementations of the current subject matter.

To further illustrate, FIG. 6C depicts a daisy chaining of state bubbles consistent with implementations of the current subject matter. Referring to FIG. 6B-C, the electronic design automation system 100 can daisy chain the state bubbles S0, S1, S2, S3, and S4 by adding, to the scaffold 620 of the state diagram 600, a plurality of transition arrows including, for example, a first transition arrow 640A, a second transition arrow 640B, a third transition arrow 640C, and a fourth transition arrow 640D. The electronic design automation system 100 can determine the direction of the first transition arrow 640A, the second transition arrow 640B, the third transition arrow 640C, and the fourth transition arrow 640D based on the scaffold 620 and/or the direction of the existing transition arrows including, for example, a fifth transition arrow 630A and a sixth transition arrow 630B.

Figure 7A:
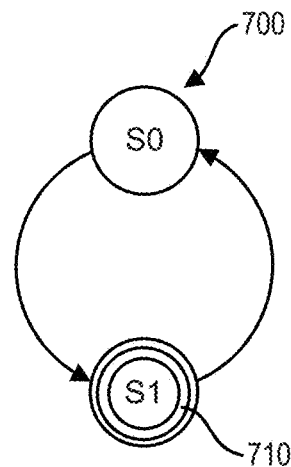
FIG. 7A depicts a user interface displaying a state diagram having an enumerated state bubble consistent with implementations of the current subject matter.

In some implementations of the current subject matter, the electronic design automation system 100 can support hierarchical graphical elements that encapsulate, for example, one or more sub-diagrams, structural block diagrams, and/or register transfer level (RTL) programming code. To further illustrate, FIGS. 7A-D depict user interfaces displaying a state diagram 700 having an enumerated state bubble 710 consistent with implementations of the current subject matter. The enumerated state bubble 710 can be associated with a plurality of enumerated values including, for example, BNZ, SQR, and NOP. Each enumerated value can correspond to a sub-diagram, a structural block diagram, and/or register transfer level programming code encapsulated by the enumerated state bubble 710. It should be appreciated that the enumerated state bubble 710 can be visually distinguishable from non-enumerated state bubbles. For instance, as shown in FIG. 7A, the enumerated state bubble 710 can be represented by two or more concentric circles while non-enumerated state bubbles can be represented by a single circle.

Figure 7B:
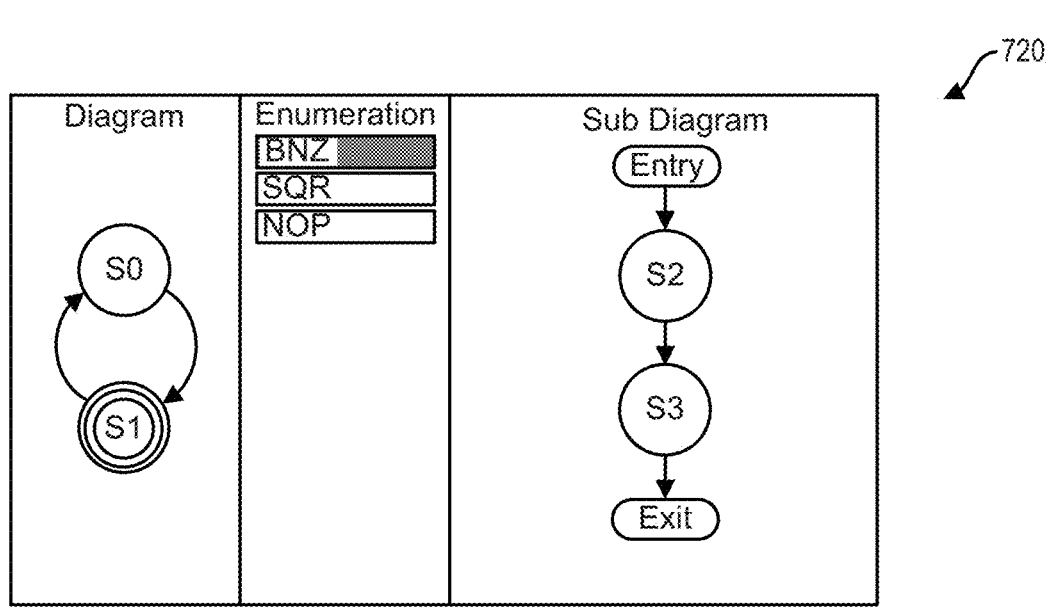
FIG. 7B depicts a user interface displaying a state diagram having an enumerated state bubble consistent with implementations of the current subject matter.
Figure 7C:
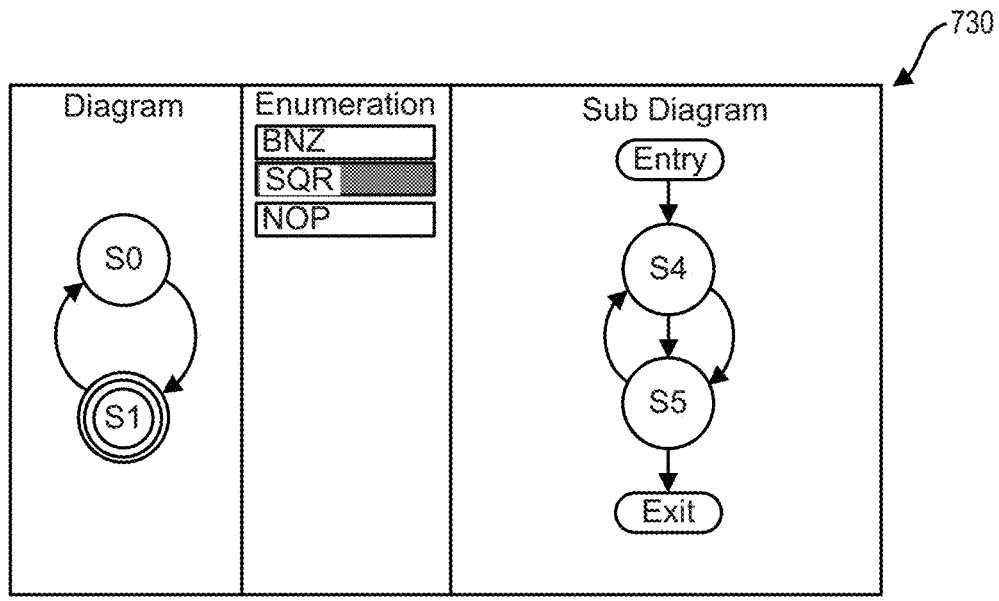
FIG. 7C depicts a user interface displaying a state diagram having an enumerated state bubble consistent with implementations of the current subject matter.
Figure 7D:
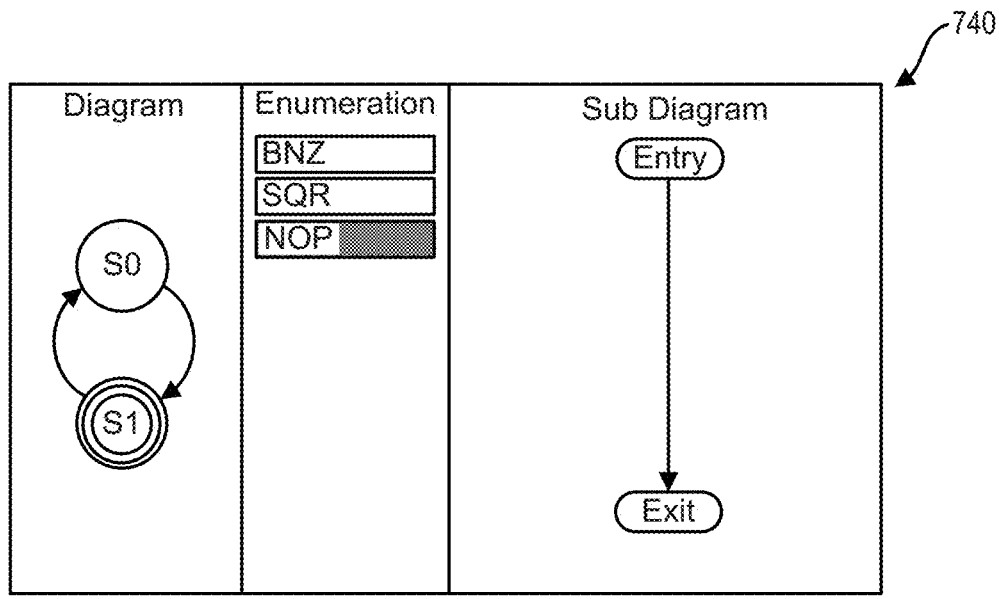
FIG. 7D depicts a user interface displaying a state diagram having an enumerated state bubble consistent with implementations of the current subject matter.

According to some implementations of the current subject matter, a user can view the encapsulated sub-diagrams, structural block diagrams, and/or register transfer level (RTL) programming code by selecting the enumerated state bubble 710 and selecting an enumerated element from the list of enumerated sub-structures. As shown in FIG. 7B-D, selecting the enumerated state bubble 710 can cause the electronic design automation system 100 to visually highlight the enumerated state bubble 710. Furthermore, the electronic design automation system 100 can display the enumerated values associated with the enumerated state bubble 710 including, for example, the values BNZ, SQR, and NOP, in a manner that enables the user to make further selections of the one or more of the enumerated values. For instance, as shown in FIG. 7B, the user can select the enumerated value BNZ, thereby causing the electronic design automation system 100 to generate a user interface 720 in which the enumerated value BNZ is visually highlighted and the corresponding sub-diagram is displayed. Alternatively and/or additionally, as shown in FIG. 7C, the user can also select the enumerated value SQR, thereby causing the electronic design automation system 100 to generate a user interface 730 in which the enumerated value SQR is visually highlighted and the corresponding sub-diagram is displayed. Furthermore, as shown in FIG. 7D, by selecting the enumerated value NOP, the user can cause the electronic design automation system 100 to generate a user interface 740 in which the enumerated value NOP is visually highlighted. The user interface 740 can further display the corresponding sub-diagram.

Figure 7E:
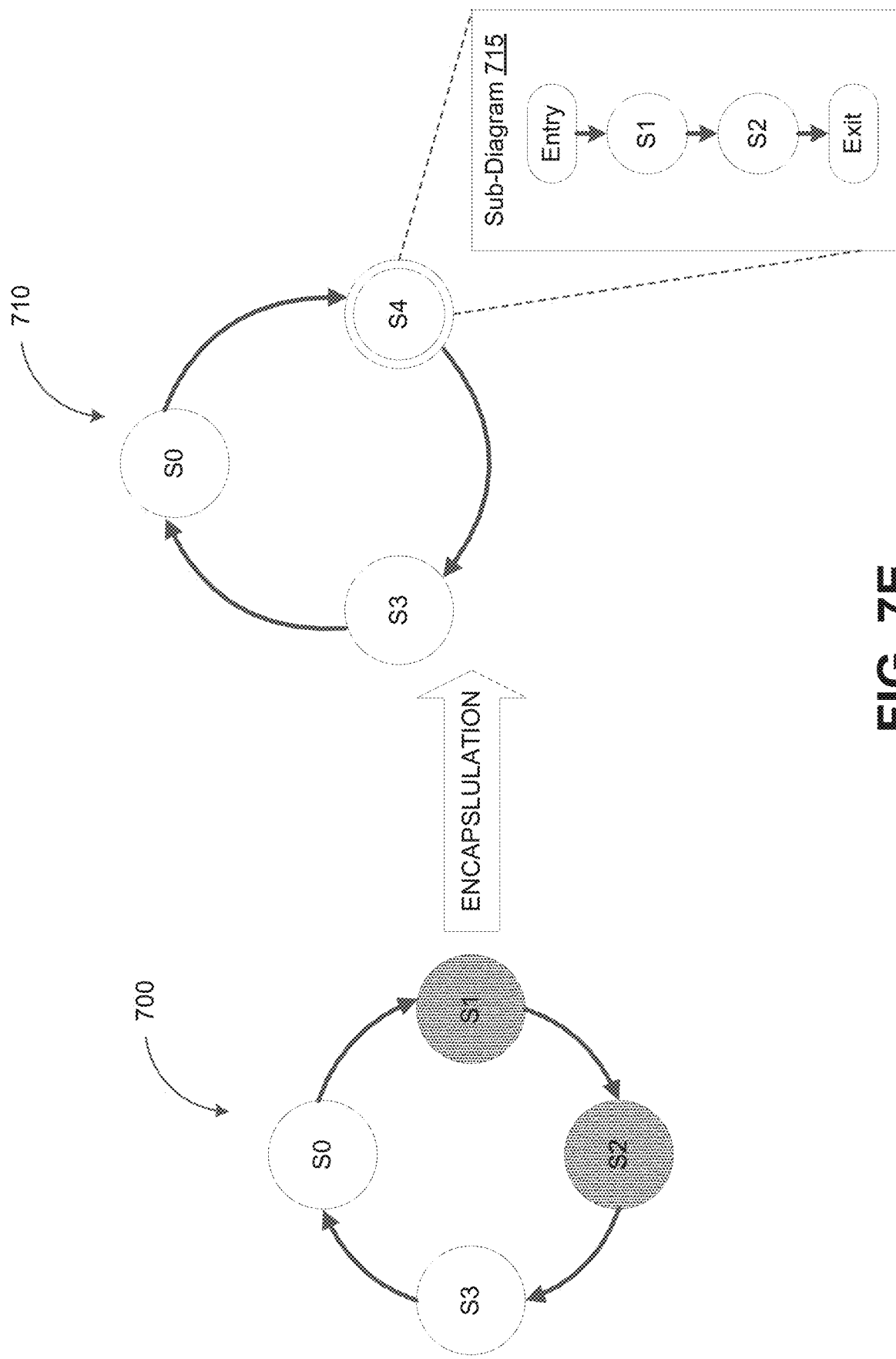
FIG. 7E depicts a user interface displaying a hierarchical encapsulation consistent with implementations of the current subject matter.

In some implementations of the current subject matter, the electronic design automation system 100 can automatically encapsulate multiple graphical elements. FIG. 7E depicts a user interface displaying a hierarchical encapsulation consistent with implementations of the current subject matter. As shown in FIG. 7E, a user can select, from within a state diagram 700, two or more state bubbles for encapsulation including, for example, the state bubble S1 and the state bubble S2. It should be appreciated that the electronic design automation system 100 can visually highlight the state bubbles S1 and S2 in response to the selection of these state bubbles. Furthermore, the electronic design automation system 100 can automatically encapsulate the state bubbles S1 and S2 as a sub-diagram 715 associated with a hierarchical state bubble S4. As shown in FIG. 7E, in the resulting state diagram 710, the hierarchical state bubble S4 can replace the state bubbles S1 and S2. It should be appreciated that the electronic design automation system 100 can automatically adjust a dimension of a scaffold (not shown) and/or the remaining state bubbles S0, S3, and S4 such that the state bubbles S0, S3, and S4 are spaced evenly along the scaffold. Furthermore, as shown in FIG. 7E, the user can choose to display the encapsulated sub-diagram 715 by at least selecting the hierarchical state bubble S4.

Figure 7F:
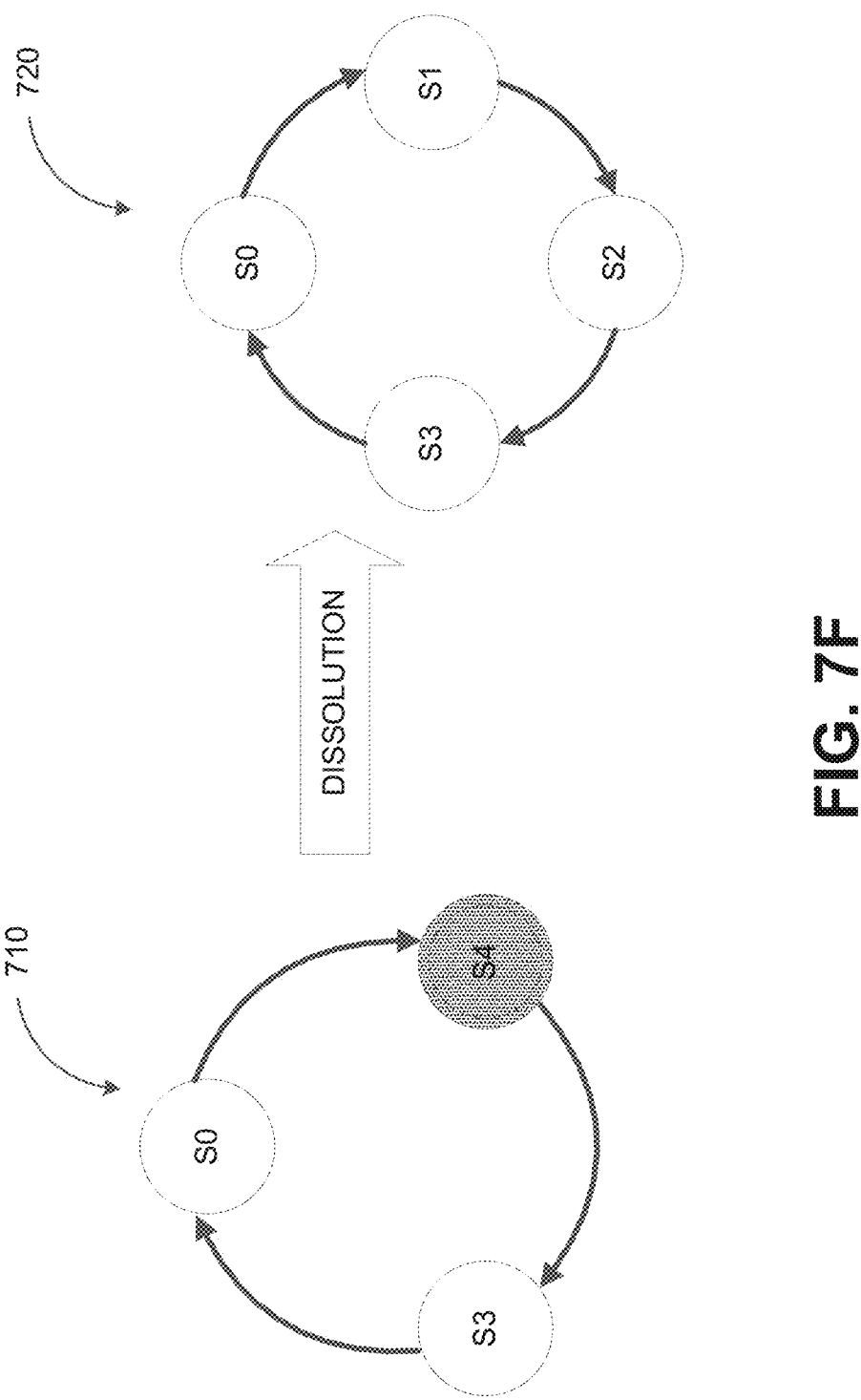
FIG. 7F depicts a user interface displaying a hierarchical dissolution consistent with implementations of the current subject matter.

Alternatively and/or additionally, the electronic design automation system 100 can also automatically dissolve an encapsulation of multiple graphical elements. FIG. 7F depicts a user interface displaying a hierarchical dissolution consistent with implementations of the current subject matter. Referring to FIG. 7F, the hierarchical state bubble S4 can be selected for dissolution. In response to the hierarchical state bubble S4 being selected for dissolution, the electronic design automation system 100 can replace the hierarchical state bubble S4 with the graphical elements encapsulated by the hierarchical state bubble S4 including, for example, the state bubble S1 and the state bubble S2. As shown in FIG. 7F, in the resulting state diagram 720, the state bubble S1 and the state bubble S2 replace the hierarchical state bubble S4.

Figure 8:
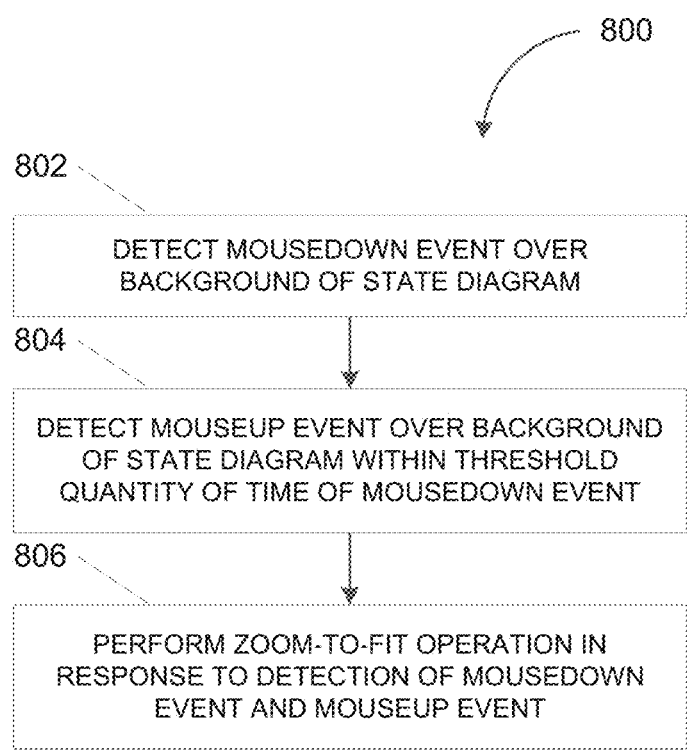
FIG. 8 depicts a flowchart illustrating a process for zoom-to-fit consistent with implementations of the current subject matter.

In some implementations of the current subject matter, the electronic design automation system 100 can be configured to support operations for adjusting a visual display of a state diagram. For example, the electronic design automation system 100 can be configured to perform a zoom-to-fit operation, which can be invoked by a user to render all graphical elements of a state diagram visible within a display window. FIG. 8 depicts a flowchart illustrating a process 800 for zoom-to-fit consistent with implementations of the current subject matter. Referring to FIG. 8, the process 800 can be performed by the electronic design automation system 100.

The electronic design automation system 100 can detect a mousedown event over a background of a state diagram (802). For example, the electronic design automation system 100 can detect a mousedown event when a pointing device button is pressed while the corresponding cursor is hovering over a background of a state diagram but not over any constituent graphical elements such as, for example, a state bubble, a scaffold, a zone, and/or the like.

The electronic design automation system 100 can detect a mouseup event over the background of the state diagram within a threshold quantity of time of the mousedown event (804). For instance, the electronic design automation system 100 can detect a mouseup event when the point device button is released while the corresponding cursor remains hovering over the background of the state diagram but not over any constituent graphical elements such as, for example, a state bubble, a scaffold, a zone, and/or the like.

The electronic design automation system 100 can perform a zoom-to-fit operation in response to the detection of the mousedown event and the mouseup event (804). For example, the electronic design automation system 100 can perform the zoom-to-fit operation by at least rendering all graphical elements of the state diagram visible within a display window. Furthermore, the electronic design automation system 100 can further display a visual cue indicating that the zoom-to-fit operation is being performed. It should be appreciated that the zoom-to-fit operation can further trigger a zoom-to-maximum-magnification of a selected coordinate within the state diagram if the cursor is hovering over a corresponding portion of the background of the state diagram and/or a selected graphical element if the cursor is hovering over the graphical element.

Figure 9A:
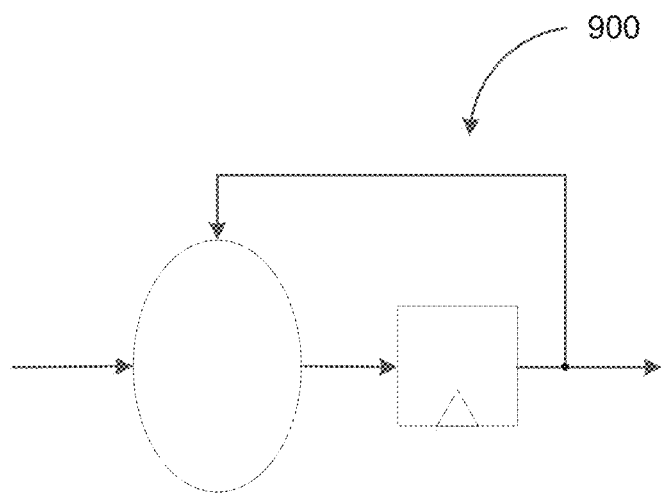
FIG. 9A depicts a feedback architecture consistent with implementations of the current subject matter.
Figure 9B:
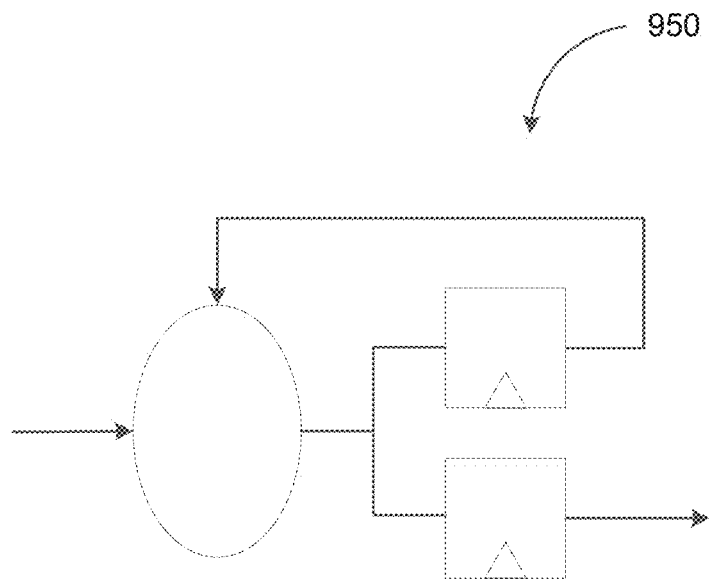
FIG. 9B depicts a synchronous architecture consistent with implementations of the current subject matter.

In some implementations of the current subject matter, the electronic design automation system 100 can be configured to detect when a state diagram generates an electronic system, such as an integrated circuit, that includes one or more synchronous feedback loops. FIG. 9A depicts a feedback architecture 900 consistent with implementations of the current subject matter. Meanwhile, FIG. 9B depicts a synchronous architecture 950 consistent with implementations of the current subject matter. In some implementations of the current subject matter, the electronic design automation system 100 can be configured to detect the feedback architecture 900 and replace the feedback architecture 900 with the synchronous architecture 950.

In some implementations of the current subject matter, the electronic design automation system 100 can support the designation of fault tolerance within an electronic system on a microscopic level. For example, a user can select a portion of an electronic system, such as an integrated circuit, and designate that portion of the electronic system as non-fault tolerant, internally fault tolerant, posing as fault tolerant, or fully fault tolerant. It should be appreciated that different portions of the electronic system can be designated with different fault tolerance levels to result in a non-homogenous electronic system that includes both fault tolerant and non-fault tolerant subsystems.

Figure 10A:
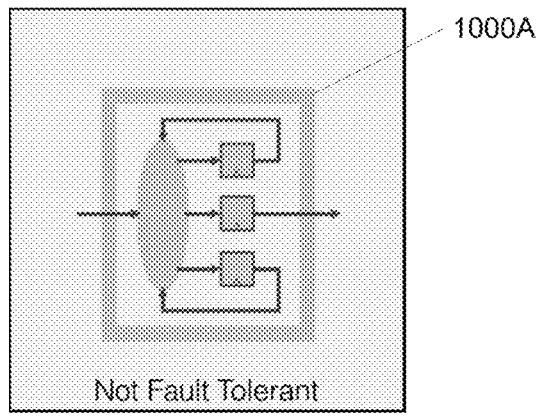
FIG. 10A depicts a user interface displaying a non-fault tolerant indicator consistent with implementations of the current subject matter.
Figure 10B:
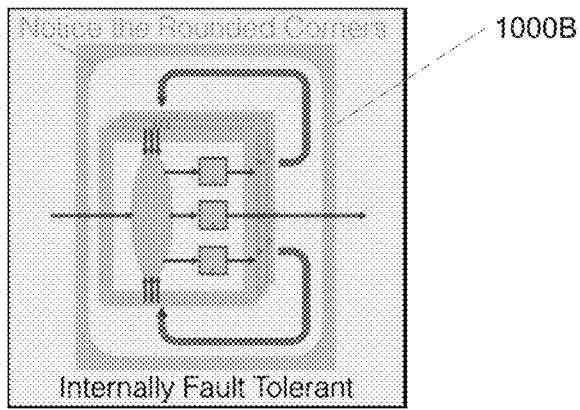
FIG. 10B depicts a user interface displaying an internally fault tolerant indicator consistent with implementations of the current subject matter.
Figure 10C:
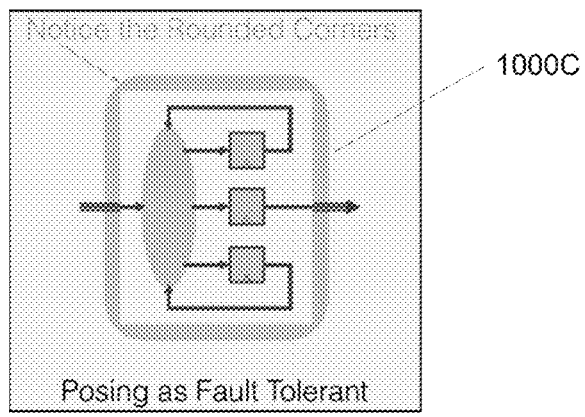
FIG. 10C depicts a user interface displaying a posing as fault tolerant indicator consistent with implementations of the current subject matter.
Figure 10D:
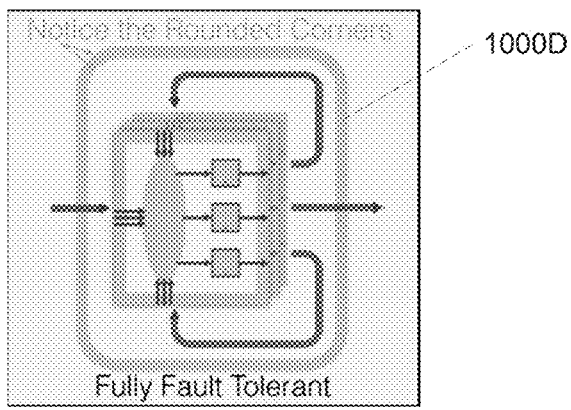
FIG. 10D depicts a user interface displaying a fully fault tolerant indicator consistent with implementations of the current subject matter.

As shown in FIG. 10A-D, fault tolerance levels can be designated visually using different visual indicators that enable a visual differentiation between the non-fault tolerant subsystems, internally fault tolerant subsystems, posing as fault tolerant subsystems, and/or fully fault tolerant subsystems of the electronic system. In some implementations of the current subject matter, these visual indicators can be different borders for demarcating portions of the electronic system as non-fault tolerant subsystems, internally fault tolerant subsystems, posing as fault tolerant subsystems, and/or fully fault tolerant subsystems. For example, FIG. 10A depicts a user interface displaying a non-fault tolerant indicator 1000A consistent with implementations of the current subject matter. FIG. 10B depicts a user interface displaying an internally fault tolerant indicator 1000B consistent with implementations of the current subject matter. FIG. 10C depicts a user interface displaying a posing as fault tolerant indicator 1000C consistent with implementations of the current subject matter. FIG. 10D depicts a user interface displaying a fully fault tolerant indicator 1000D consistent with implementations of the current subject matter.

Figure 11:
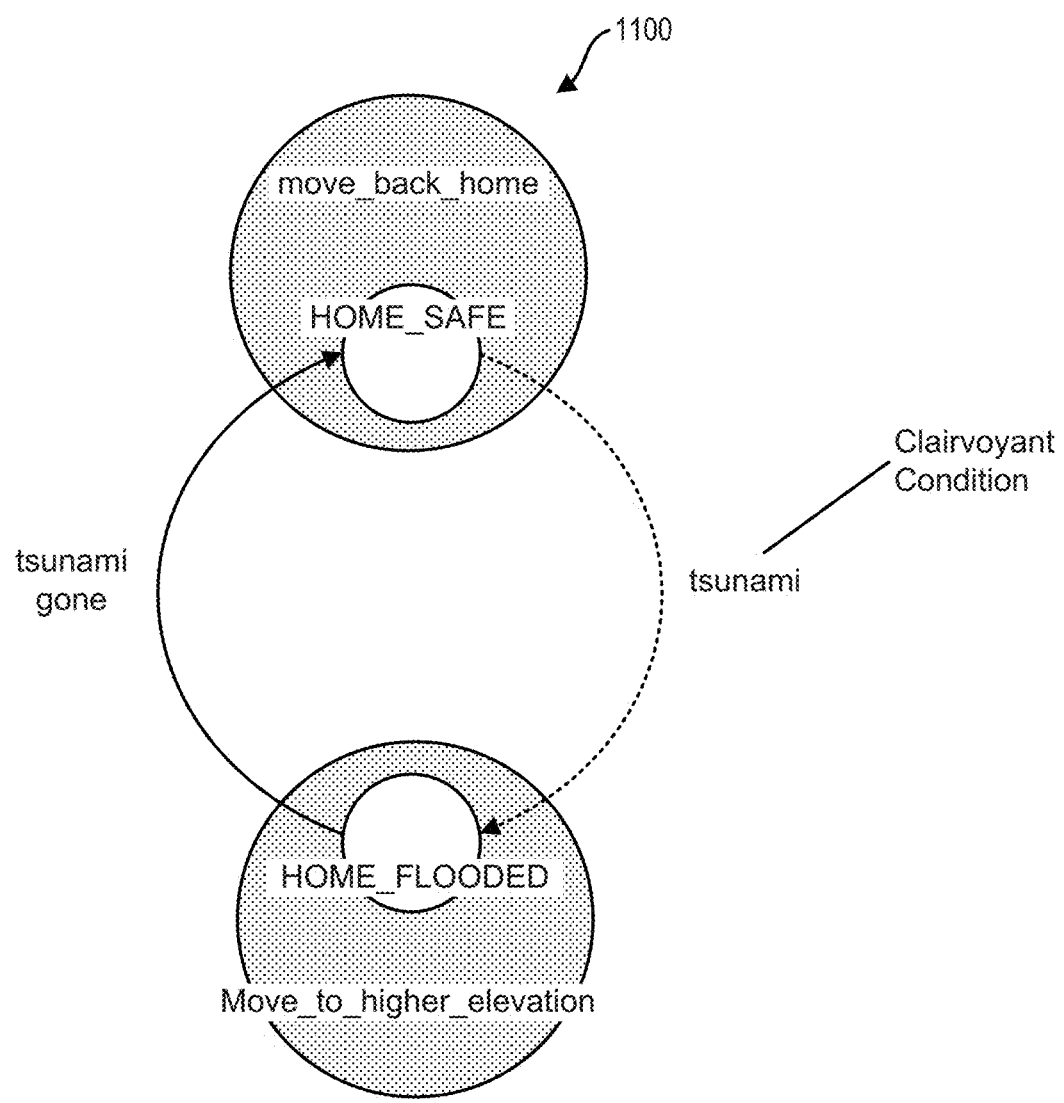
FIG. 11 depicts a clairvoyant state machine consistent with implementations of the current subject matter.

In some implementations of the current subject matter, a fully fault tolerant electronic system and/or a fully fault tolerant subsystem can be used to implement a clairvoyant state machine. To further illustrate, FIG. 11 depicts a clairvoyant state machine 1100 consistent with implementations of the current subject matter. As shown in FIG. 11, the clairvoyant state machine 1100 can be configured to transition between a HOME_SAFE state and a HOME_FLOODED state in response to the conditions "tsunami" and "tsunami gone." For example, where the clairvoyant state machine 1100 predicts the condition "tsunami," the clairvoyant state machine 1100 can transition from the HOME_SAFE state to the HOME_FLOODED state prior to an actual occurrence of the condition "tsunami." Here, the clairvoyant state machine 1100 may respond to the condition "tsunami" by specifying the controlled signal move_to_higher_elevation, which is associated with the HOME_FLOODED state. Alternatively and/or additionally, where the clairvoyant state machine 1100 predicts the condition "tsunami gone," the clairvoyant state machine 1110 can transition from the HOME_FLOODED state to the HOME_SAFE state before the condition "tsunami gone" actually occurs. The clairvoyant state machine 1100 may further respond to the "tsunami gone" condition by specifying the controlled signal move_back_home, which is associated with the HOME_SAFE state.

Referring to FIGS. 10D and 11, a fully fault tolerant electronic system, such as the one indicated by the indicator 1000D, can implement the clairvoyant state machine 1100 by at least evaluating one or more alternatively possible clairvoyant conditions using redundant elements within the fully fault tolerant electronic system. That is, the fully fault tolerant electronic system can evaluate all possible input values for the clairvoyant condition. For instance, some redundant elements can evaluate an input in which the clairvoyant condition "tsunami" is true while other redundant elements can evaluate an input in which the clairvoyant condition "tsunami" is false. Once the real value for the clairvoyant condition is determined, the fully fault tolerant electronic system can then correct those redundant elements that have been given the incorrect value of the clairvoyant condition. In doing so, the clairvoyant state machine 1100 can eliminate the output lag caused by state transitions.

Figure 12:
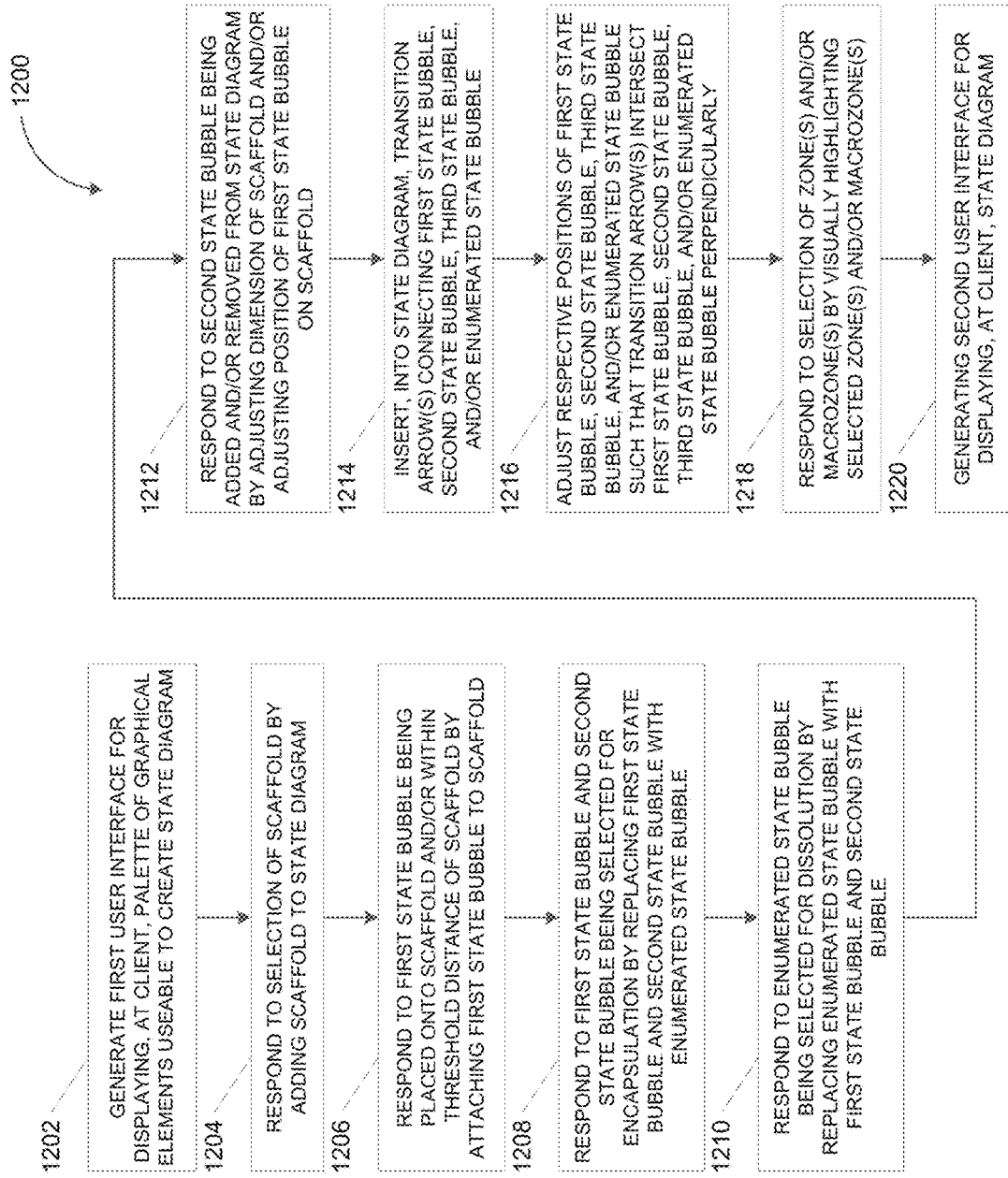
FIG. 12 depicts a flowchart illustrating a process for generating a state diagram consistent with implementations of the current subject matter.

FIG. 12 depicts a flowchart for a process 1200 for generating a state diagram consistent with implementations of the current subject matter. Referring to FIG. 12, the process 1200 can be performed by the electronic design automation system 100, for example, by the design module 110.

The electronic design automation system 100 can generate a first user interface for displaying, at a client, a palette of graphical elements useable to create a state diagram (1202). In some implementations of the current subject matter, the electronic design automation system 100 can generate a user interface that displays, at a client such as the first client 160A and/or the second client 160B, a palette of graphical elements that can be used to create a state diagram representative of an electronic system such as, for example, an integrated circuit. The palette of graphical elements can include scaffolds, state bubbles, zones, transition arrows, and/or the like.

The electronic design automation system 100 can respond to a selection of a scaffold by at least adding the scaffold to the state diagram (1204). For example, as shown in FIGS. 2A-D, the user can select to add to a state diagram, the circular scaffold 210, the vertical linear scaffold 220, the horizontal linear scaffold 230, and/or the arc scaffold 240.

The electronic design automation system 100 can respond to a first state bubble being placed onto the scaffold and/or within a threshold distance of the scaffold by at least attaching the first state bubble to the scaffold (1206). In some implementations of the current subject matter, graphical elements such as state bubbles can have an affinity for a scaffold. Thus, when the user drags a state bubble onto a scaffold and/or within a threshold distance of the scaffold, the electronic design automation system 100 can automatically attach the state bubble to the scaffold. As noted, the state bubbles can be attached to the scaffold in either a free floating and/or a rigidly fixed manner.

The electronic design automation system 100 can respond to the first state bubble and a second state bubble being selected for encapsulation by at least replacing the first state bubble and the second state bubble with enumerated hierarchical state bubble (1208). In some implementations of the current subject matter, the electronic design automation system 100 can encapsulate multiple state bubbles into a single state diagram and replace the state bubbles with a single hierarchical state bubble. For instance, as shown in FIG. 7E, the user can select the state bubbles S1 and S2 for encapsulation. The electronic design automation system 100 can respond to the selection of the state bubbles S1 and S2 for encapsulation by replacing the state bubbles S1 and S2 with the hierarchical state bubble S4. A hierarchical state bubble can be a type of enumerated state bubble that includes only a single enumerated sub-structure. As noted, a single enumerated state bubble can be associated with multiple sub-diagrams, structural block diagrams, and/or register transfer level programming code. For example, as shown in FIGS. 7A-D, the electronic design automation system 100 can generate one or more user interfaces (e.g., the user interface 720, the user interface 730, and/or the user interface 740) displaying the sub-diagrams, structural block diagrams, and/or register transfer level programming code encapsulated by the enumerated state bubble.

The electronic design automation system 100 can respond to the enumerated state bubble being selected for dissolution by at least replacing the enumerated state bubble with the first state bubble and the second state bubble (1210). In some implementations of the current subject matter, the electronic design automation system 100 can also dissolve an enumerated state bubble by replacing the enumerated state bubble with the state bubbles forming the sub-diagram encapsulated by the enumerated state bubble. For example, as shown in FIG. 7F, the electronic design automation system 100 can also dissolve the enumerated state bubble S4 by replacing the enumerated state bubble S4 with the state bubbles S1 and S2.

The electronic design automation system 100 can respond to the second state bubble being added and/or removed from the state diagram by at least adjusting a dimension of the scaffold and/or adjusting a position of the first state bubble on the scaffold (1212). In some implementations of the subject matter, the electronic design automation system 100 can adjust a dimension of a scaffold in order to accommodate the addition and/or removal of one or more state bubbles from the scaffold. Alternatively and/or additionally, the electronic design automation system 100 can adjust the relative positions of the state bubbles attached to the scaffold. It should be appreciated that the electronic design automation system 100 can perform these adjustments in order for the state bubbles to be evenly spaced along the scaffold.

The electronic design automation system 100 can insert one or more transition arrows connecting the first state bubble, the second state bubble, the third state bubble, and/or the enumerated state bubble (1214). In some implementations of the current subject matter, the electronic design automation system 100 can automatically insert one or more transition arrows into a state diagram in order to connect the state bubbles in the state diagram. The electronic design automation system 100 can determine the direction of these transition arrows based on the scaffold of the state diagram and/or the direction of any existing transition arrows in the state diagram. In doing so, the electronic design automation system 100 can insert transition arrows that directionally connect the state bubbles in the state diagram to generate, for example, a daisy chain of state bubbles shown in FIG. 6C.

The electronic design automation system 100 can adjust the respective positions of the first state bubble, the second state bubble, the third state bubble, and/or the enumerated state bubble such that the one or more transition arrows intersect the first state bubble, the second state bubble, the third state bubble, and/or the enumerated state bubble perpendicularly (1216). In some implementations of the current subject matter, the electronic design automation system 100 can automatically adjust the positions of the graphical elements in a state diagram in order to maintain a perpendicular and/or centered alignment between the graphical elements. For example, the state bubbles in a state diagram can be moved outward and away from a center point of a scaffold until the center points of the state bubbles lie outside of the centerline of the scaffold. The state bubbles can be adjusted in this manner such that the transition arrows intersect the state bubbles perpendicularly and traverse along a centerline of the scaffolds. To further illustrate, FIGS. 5A-E depicts orthogonal circle math that can be used to determine the coordinates of where one or more transition arrows and state bubbles should intersect.

The electronic design automation system 100 can respond to a selection of one or more zones and/or macrozones by at least visually highlighting the selected zones and/or macrozones (1218). For example, as shown in FIG. 3A, a zone can identify a plurality of transition arrows exiting, entering, and/or self-transitioning at a state bubble. The zone can include one or more controlled signals associated with programming code. Meanwhile, as shown in FIG. 3B, a macrozone can identify a plurality of transition arrows that enter, exit, and/or self-transition with respect to a group of state bubbles. The macrozone can also include one or more controlled signals associated with programming code. The electronic design automation system 100 can respond to the selection of a zone and/or a macrozone by at least visually highlighting the selected zone and/or macrozone.

The electronic design automation system 100 can generate a second user interface for displaying, at the client, the state diagram (1220). In some implementations of the current subject matter, the electronic design automation system 100 can generate a user interface that displays, at a client such as the first client 160A and/or the second client 160B, a state diagram that has been configured and/or adjusted in accordance with one or more of the operations 1204 through 1216. For example, the electronic design automation system 100 can generate a user interface displaying a state diagram having one or more scaffolds, state bubbles, zones, transition arrows, and/or enumerated state bubbles.

Figure 13:
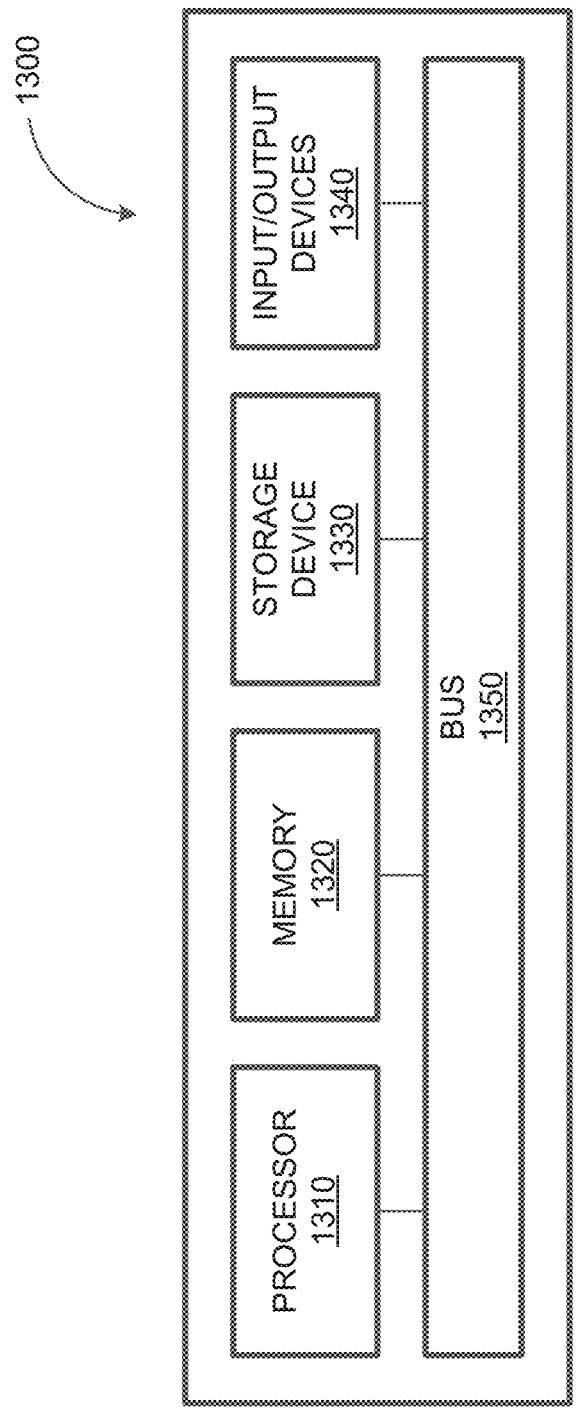
FIG. 13 depicts a system diagram illustrating a computing system consistent with implementations of the current subject matter.

FIG. 13 depicts a block diagram illustrating a computing system 1300 consistent with implementations of the current subject matter. Referring to FIGS. 1 and 11, the computing system 1300 can be used to implement the electronic design automation system 100 and/or any components therein.

As shown in FIG. 13, the computing system 1300 can include a processor 1310, a memory 1320, a storage device 1330, and input/output devices 1340. The processor 1310, the memory 1320, the storage device 1330, and the input/output devices 1340 can be interconnected via a system bus 1350. The processor 1310 is capable of processing instructions for execution within the computing system 1300. Such executed instructions can implement one or more components of, for example, the electronic design automation system 100. In some example embodiments, the processor 1310 can be a single-threaded processor. Alternately, the processor 1310 can be a multi-threaded processor. The processor 1310 is capable of processing instructions stored in the memory 1320 and/or on the storage device 1330 to display graphical information for a user interface provided via the input/output device 1340.

The memory 1320 is a computer readable medium such as volatile or non-volatile that stores information within the computing system 1300. The memory 1320 can store data structures representing configuration object databases, for example. The storage device 1330 is capable of providing persistent storage for the computing system 1300. The storage device 1330 can be a floppy disk device, a hard disk device, an optical disk device, or a tape device, or other suitable persistent storage means. The input/output device 1340 provides input/output operations for the computing system 1300. In some example embodiments, the input/output device 1340 includes a keyboard and/or pointing device. In various implementations, the input/output device 1340 includes a display unit for displaying graphical user interfaces.

According to some example embodiments, the input/output device 1340 can provide input/output operations for a network device. For example, the input/output device 1340 can include Ethernet ports or other networking ports to communicate with one or more wired and/or wireless networks (e.g., a local area network (LAN), a wide area network (WAN), the Internet).

In some example embodiments, the computing system 1300 can be used to execute various interactive computer software applications that can be used for organization, analysis and/or storage of data in various formats. Alternatively, the computing system 1300 can be used to execute any type of software applications. These applications can be used to perform various functionalities, e.g., planning functionalities (e.g., generating, managing, editing of spreadsheet documents, word processing documents, and/or any other objects, etc.), computing functionalities, communications functionalities, etc. The applications can include various add-in functionalities (e.g., SAP Integrated Business Planning as an add-in for a spreadsheet and/or other type of program) or can be standalone computing products and/or functionalities. Upon activation within the applications, the functionalities can be used to generate the user interface provided via the input/output device 1340. The user interface can be generated and presented to a user by the computing system 1300 (e.g., on a computer screen monitor, etc.).

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, include machine instructions for a programmable processor, and can be implemented in a high-level procedural and/or object-oriented programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example as would a processor cache or other random access memory associated with one or more physical processor cores.

To provide for interaction with a user, one or more aspects or features of the subject matter described herein can be implemented on a computer having a display device, such as for example a cathode ray tube (CRT), a liquid crystal display (LCD) or a light emitting diode (LED) monitor for displaying information to the user and a keyboard and a pointing device, such as for example a mouse or a trackball, by which the user may provide input to the computer. Other kinds of devices can be used to provide for interaction with a user as well. For example, feedback provided to the user can be any form of sensory feedback, such as for example visual feedback, auditory feedback, or tactile feedback; and input from the user may be received in any form, including, but not limited to, acoustic, speech, or tactile input. Other possible input devices include, but are not limited to, touch screens or other touch-sensitive devices such as single or multi-point resistive or capacitive trackpads, voice recognition hardware and software, optical scanners, optical pointers, digital image capture devices and associated interpretation software, and the like.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A computer-implemented method for creating a state diagram of an integrated circuit design, the method comprising:
   generating a first user interface at a client, the first user interface for displaying a plurality of graphical elements that can be selected for creating the state diagram, the plurality of graphical elements comprising one or more state bubbles each representing one or more states of the integrated circuit design, and at least one scaffold to position at least one of the one or more state bubbles in the state diagram; and
   generating a second user interface at the client for displaying the state diagram that is created from a plurality of selected graphical elements, the generating the second user interface further comprising:
      adding a selected scaffold to the state diagram in response to a scaffold selection from the at least scaffold in the first user interface;
      adding a selected state bubble to the state diagram in response to a state bubble selection from the one or more state bubbles in the first user interface;
      attaching the selected state bubble to the selected scaffold in the state diagram in the second user interface; and
      automatically adjusting a position of the selected state bubble on the selected scaffold to maintain a simplified graphical representation of the state machine in the second user interface.

2. The method in accordance with claim 1, wherein the generating further comprises:
   adding at least one transition arrow between pairs of the selected state bubbles of the state machine, in response to user input to the second user interface.

3. The method in accordance with claim 1, wherein the generating further comprises:
   removing, from the scaffold, a state bubble selected for removal from the state diagram in response to a state bubble removal command to the second user interface; and
   automatically readjusting the position of remaining selected state bubbles on the selected scaffold.

4. The method in accordance with claim 1, wherein the generating further comprises:

detecting a mousedown event over a background of the state diagram;

detecting a mouseup event over the background of the state diagram within a threshold quantity of time of the mousedown event; and in response to the mouseup event being detected within the threshold quantity of time of the mousedown event, performing a zoom-to-fit operation on the state diagram to automatically adjust the position of the selected state bubble on the selected scaffold.

5. The method in accordance with claim 1, wherein automatically adjusting a position of the selected state bubble on the selected scaffold includes evenly spacing the selected state bubble from adjacent selected state bubbles on the selected scaffold.

6. The method in accordance with claim 1, wherein the state bubble selection includes dragging the selected state bubble from the first user interface and dropping the selected state bubble within the second user interface.

7. The method in accordance with claim 6, wherein the dragging and dropping are performed by user control of a mouse in communication with the computer.

8. A system for creating a state diagram of an integrated circuit design, the system comprising:

at least one programmable processor; and a machine-readable medium storing instructions that, when executed by the at least one programmable processor, cause the at least one programmable processor to perform operations comprising:

generate a first user interface at a client, the first user interface for displaying a plurality of graphical elements that can be selected for creating the state diagram, the plurality of graphical elements comprising one or more state bubbles each representing one or more states of the integrated circuit design, and at least one scaffold to position at least one of the one or more state bubbles in the state diagram; and generate a second user interface at the client for displaying the state diagram that is created from a plurality of selected graphical elements, the operation to generate the second interface further comprises:

adding a selected scaffold to the state diagram in response to a scaffold selection from the at least scaffold in the first user interface;

adding a selected state bubble to the state diagram in response to a state bubble selection from the one or more state bubbles in the first user interface;

attaching the selected state bubble to the selected scaffold in the state diagram in the second user interface; and automatically adjusting a position of the selected state bubble on the selected scaffold to maintain a simplified graphical representation of the state machine in the second user interface.

9. The system in accordance with claim 8, wherein the generating further comprises:

adding at least one transition arrow between pairs of the selected state bubbles of the state machine, in response to user input to the second user interface.

10. The system in accordance with claim 9, wherein the generating further comprises:

removing, from the scaffold, a state bubble selected for removal from the state diagram in response to a state bubble removal command to the second user interface; and automatically readjusting the position of remaining selected state bubbles on the selected scaffold.

11. The system in accordance with claim 9, wherein the generating further comprises:

detecting a mousedown event over a background of the state diagram;

detecting a mouseup event over the background of the state diagram within a threshold quantity of time of the mousedown event; and in response to the mouseup event being detected within the threshold quantity of time of the mousedown event, performing a zoom-to-fit operation on the state diagram to automatically adjust the position of the selected state bubble on the selected scaffold.

12. The system in accordance with claim 9, wherein automatically adjusting a position of the selected state bubble on the selected scaffold includes evenly spacing the selected state bubble from adjacent selected state bubbles on the selected scaffold.

13. The system in accordance with claim 9, wherein the state bubble selection includes dragging the selected state bubble from the first user interface and dropping the selected state bubble within the second user interface.

14. The system in accordance with claim 13, wherein the dragging and dropping are performed by user control of a mouse in communication with the computer.

15. A non-transitory computer program product storing instructions that, when executed by at least one programmable processor, cause operations comprising:

generating a first user interface at a client, the first user interface for displaying a plurality of graphical elements that can be selected for creating a state diagram of an integrated circuit design, the plurality of graphical elements comprising one or more state bubbles each representing one or more states of the integrated circuit design, and at least one scaffold to position at least one of the one or more state bubbles in the state diagram;

generating a second user interface at the client for displaying the state diagram that is created from a plurality of selected graphical elements adding a selected scaffold to the state diagram in response to a scaffold selection from the at least scaffold in the first user interface;

adding a selected state bubble to the state diagram in response to a state bubble selection from the one or more state bubbles in the first user interface;

attaching the selected state bubble to the selected scaffold in the state diagram in the second user interface; and automatically adjusting a position of the selected state bubble on the selected scaffold to maintain a simplified graphical representation of the state machine in the second user interface.

16. The computer program product in accordance with claim 15, further comprising:

adding at least one transition arrow between pairs of the selected state bubbles of the state machine, in response to user input to the second user interface.

17. The computer program product in accordance with claim 15, further comprising:

removing, from the scaffold, a state bubble selected for removal from the state diagram in response to a state bubble removal command to the second user interface; and automatically readjusting the position of remaining selected state bubbles on the selected scaffold.

18. The computer program product in accordance with claim 15, further comprising:
- detecting a mousedown event over a background of the state diagram;
- detecting a mouseup event over the background of the state diagram within a threshold quantity of time of the mousedown event; and
- in response to the mouseup event being detected within the threshold quantity of time of the mousedown event, performing a zoom-to-fit operation on the state diagram to automatically adjust the position of the selected state bubble on the selected scaffold.

19. The computer program product in accordance with claim 15, wherein automatically adjusting a position of the selected state bubble on the selected scaffold includes evenly spacing the selected state bubble from adjacent selected state bubbles on the selected scaffold.

20. The computer program product in accordance with claim 15, wherein the state bubble selection includes dragging the selected state bubble from the first user interface and dropping the selected state bubble within the second user interface.

21. The computer program product in accordance with claim 20, wherein the dragging and dropping are performed by user control of a mouse in communication with the computer.

\* \* \* \* \*